United States Patent [19]

Maruyama et al.

[11] Patent Number: 5,761,779
[45] Date of Patent: Jun. 9, 1998

[54] METHOD OF PRODUCING FINE METAL SPHERES OF UNIFORM SIZE

[75] Inventors: Tadakatsu Maruyama; Osamu Kitamura; Yasuhide Ohno; Tosiharu Kikuchi, all of Kawasaki; Yasuhiro Suzuki; Hisao Kuribayashi, both of Kitakyushu; Tomohiro Uno, Kawasaki, all of Japan

[73] Assignee: Nippon Steel Corporation, Tokyo, Japan

[21] Appl. No.: 596,694

[22] Filed: Feb. 5, 1996

Related U.S. Application Data

[63] Continuation of Ser. No. 154,484, Nov. 19, 1993, abandoned, which is a continuation of Ser. No. 741,486, filed as PCT/JP90/01591, Aug. 7, 1991, abandoned.

[30] Foreign Application Priority Data

| Dec. 7, 1989 | [JP] | Japan | 1-320296 |
| Feb. 15, 1990 | [JP] | Japan | 2-035256 |
| Apr. 24, 1990 | [JP] | Japan | 2-109779 |
| Apr. 24, 1990 | [JP] | Japan | 2-109780 |
| Jul. 6, 1990 | [JP] | Japan | 2-179263 |
| Jul. 6, 1990 | [JP] | Japan | 2-179264 |
| Jul. 6, 1990 | [JP] | Japan | 2-179265 |
| Jul. 10, 1990 | [JP] | Japan | 2-183643 |
| Jul. 10, 1990 | [JP] | Japan | 2-183644 |

[51] Int. Cl.⁶ .................................................. B23K 35/02
[52] U.S. Cl. ................... 291/1.122; 75/342; 228/56.3; 437/183
[58] Field of Search ....................... 29/1.22; 75/342; 228/56.3, 254; 437/183

[56] References Cited

U.S. PATENT DOCUMENTS

| 2,919,471 | 1/1960 | Hechnger | 29/1.22 X |
| 2,967,927 | 1/1961 | Weismann | 29/1.22 X |
| 3,642,393 | 2/1972 | Ross et al. | 29/1.22 X |
| 3,977,069 | 8/1976 | Domaingue, Jr. | |
| 4,003,232 | 1/1977 | Trendov | 29/1.22 X |

FOREIGN PATENT DOCUMENTS

| 569365 | 1/1959 | Canada | 29/1.22 |
| 0 134 702 | 8/1984 | European Pat. Off. . | |
| 0 281 511 | 1/1988 | European Pat. Off. . | |
| 0 325 660 | 8/1989 | European Pat. Off. . | |
| 1 169 884 | 5/1964 | Germany . | |

(List continued on next page.)

OTHER PUBLICATIONS

Abstracts of Japan JP58135744 Dec. 1983.
EPO Search Report in 91900363.2 Jun. 1993.
Patent Abstracts of Japan vol. 9, No. 27521 (M–426) 2 Nov. 1985 & JP–A–60 121 063 (Tanaka Kikinzoku Kogyo) 28 Jun. 1985. *Abstract*.

*Primary Examiner*—Joseph M. Gorski
*Attorney, Agent, or Firm*—Pollock, Vande Sande & Priddy

[57] ABSTRACT

A method of producing soft fine metal spheres for semiconductor packaging from a material selected from soft metals and soft alloys. A plurality of fine wires made of the material are arranged in parallel on a flat base plate. Each of the wires has a diameter of not more than 100 μm. The fine wires are cut into wire chips having an equal mass relative to each other and a chip length/chip diameter ratio between 5 and 100 by utilizing a cutting jig having cutting edges which are arranged at a constant pitch. The resulting wire chips are arranged so that the chips are spaced apart a minimum distance sufficient to prevent the chips from merging when melted. The resulting spaced-apart wire chips are heated to a temperature up to but not exceeding 100° C. above the melting point thereof, thereby forming the chips into molten spheres. The resulting molten spheres are cooled, thereby forming solid spheres having a diameter within about 5% of a desired diameter.

19 Claims, 19 Drawing Sheets

FOREIGN PATENT DOCUMENTS

| | | |
|---|---|---|
| 1 521 894 | 10/1969 | Germany . |
| 2 261 281 | 6/1974 | Germany . |
| 26-5610 | 12/1924 | Japan . |
| 28-3974 | 8/1928 | Japan . |
| 56-65929 | 10/1954 | Japan . |
| 41-11525 | 10/1963 | Japan . |
| 53-28878 | 3/1978 | Japan . |
| 60-5804 | 1/1985 | Japan . |
| 61-111634 | 7/1986 | Japan . |
| 63-33507 | 2/1988 | Japan . |
| 63-111101 | 5/1988 | Japan . |
| 63-0130701 | 6/1988 | Japan ........................................ 75/342 |
| 63-55378 | 11/1988 | Japan . |
| 64-49333 | 3/1989 | Japan . |
| 52-36508 | 9/1997 | Japan . |

FIG. 10
FIG. 11
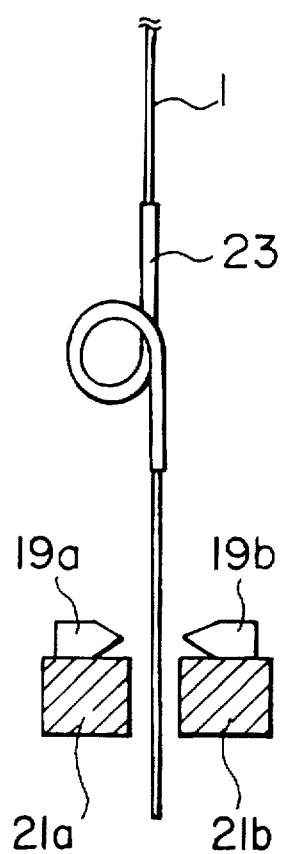
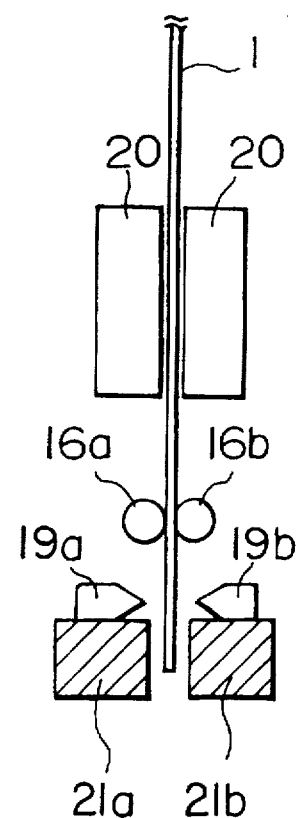

METHOD OF PRODUCING FINE METAL SPHERES OF UNIFORM SIZE

This application is a Continuation of U.S. patent application Ser. No. 08/154,484, filed Nov. 19, 1993 which is a Continuation of U.S. patent application Ser. No. 07/741,486, filed as PCT/JP90/01591 Aug. 7, 1991, both now abandoned.

TECHNICAL FIELD

The present invention relates to a method of efficiently producing, with high degree of uniformity in size, fine metal spheres such as bumps which are used as bonding material in bonding methods such as TAB (Tape Automated Bonding) method or flip-chip bonding method which are used in the field of semiconductor packaging.

BACKGROUND ART

TAB method and flip-chip methods are known as semiconductor packaging techniques which make use of bumps. Metals such as gold are used as the material of bumps. Various shapes of bumps are used such as spherical forms, rectangular parallelopiped forms and forms intermediate between the spherical and rectangular parallelopiped forms.

Functions of the bumps are to electrically and mechanically bond two opposing electrical members. In general, the bump is placed between these two members in alignment and then heat and pressure are applied to the bump so as to bond these two members. The bump, when considered from the above-mentioned function, preferably has a spherical shape which is easy to deform. Actually, however, bumps have rectangular parallelopiped shapes most cases. This is because that bumps of parallelopiped shapes can easily be produced by plating or etching, so that bumps of such shapes are used although they are rather inconvenient to use. Plating is the most popular method for forming bumps. This method, however, involves a problem in that the purity and composition of the metal used as the material of the bump are undesirably limited, in addition to the above-mentioned problem concerning the shape.

Formation of a bump by plating is conducted either by directly plating the electrode of an IC by a bump metal which is in most cases gold of a high purity, or by forming a bump on a glass substrate by plating and then transferring the same to the end of the lead on a TAB tape.

The formation of bumps by plating, however, requires equipment of a large scale and, in addition, suffers from restriction in the metal composition as stated above. In particular, the first-mentioned plating method which relies upon direct plating on IC chip electrodes impairs the yield of the IC chip products since the IC chips have to undergo the plating process.

As stated before, bumps of spherical shapes have not been used popularly, although the spherical shape is preferred from the view point of function. This fact is mainly attributable to difficulty encountered in the production of fine metal spheres with a high degree of uniformity in size.

Various methods have been proposed and used for forming fine metal spheres such as water atomization, gas atomization, vacuum atomization, centrifugal atomization, roller atomization, supersonic atomization, and so forth. The water atomization, however, is disadvantageous in that the metal spheres formed by this method are irregular in shape. The gas atomizing method also is disadvantageous in that it cannot produce fine spheres. The centrifugal method is suitable for producing comparatively fine spheres in an industrial scale. As described in Journal of Metals, January 1981, pp 13–18, however, the metal spheres formed by this method have a rather wide size distribution of 30 to 200 μm. In order to use metal spheres formed by this method as bumps, it is necessary to select only spheres of a specified size suitable for this purpose, by subjecting the formed spheres to, for example, sieving. Sieving the spheres in an industrial scale seriously reduces the yield and, hence, is quite impractical. These are the reasons why no positive attempt has been made to put spherical bumps into industrial use.

DISCLOSURE OF THE INVENTION

Accordingly, an object of the present invention is to establish a method which enables an efficient production of fine metal spheres with such high degree of uniformity in size and shape as to enable the use of these spheres directly as bumps in semiconductor packaging process, without suffering from restriction in purity and composition of the sphere material and without necessitating any classification such as sieving.

To this end, according to the present invention, there is provided a method of producing fine metal spheres with a high degree of uniformity in size, including the steps of cutting an ultra-fine metal wire i.e., having a diameter no more than 100 μm into chips of a predetermined length, and heating the chips to a temperature higher than the melting point of the chip thereby spheroidizing the chips.

One of the most critical requirements for producing bumps with a uniform size is to cut the ultra-fine metal wire exactly at a constant length. Obviously, the precision of the cutting length can be enhanced by minimizing the diameter of the ultra-fine wire and selecting a comparatively large cutting length. In general, a bump has an extremely small size, e.g., 100 microns or below in diameter. The cutting length is usually 0.5 mm or less and 1 mm at the largest, however the wire diameter may be reduced. In addition, metals suitable for use as a bump material are usually soft so that ultra-fine wires formed from such metals are easily deformed by, for example, the force of gravity. Ultra-fine wires of such soft metals are obviously nonstiff, so that a difficulty is encountered in feeding the wires in such a manner as to feed such wires without any bend.

Thus, one of the critical features of the present invention resides in that ultra-fine metal wires are precisely cut at a constant length.

Another critical feature is that the chips cut from the ultra-fine metal wires are heated to a temperature above the melting point so as to be spheroidized. A description will be given of this critical feature. In general, molten metal exhibits a large surface tension, so that a fine solid metal heated to a temperature above the melting point naturally tends to form a sphere. From a theoretical point of view, therefore, it is possible to form a metal sphere by preparing a metal solid of the same mass as that of the sphere to be formed, melting the metal solid and then slowly cooling the melt to allow it to solidify.

Needless to say, thee is a limit in size at which the force of gravity exceeds the surface tension to thereby make the sphere have a flattened form. Flattening by the force of gravity, however, does not cause any problem in the invention because the influence of the force of gravity is materially negligible due to extremely small size of the spheres, e.g., 0.5 mm or smaller.

The present inventors have made an intense study to develop a method which would enable an efficient production of fine melt spheres by using the above-described principle, and examined conditions for putting the production method to a practical industrial use. As a result, the inventors have found that the following conditions (1) to (5) are most critical.

(1) Spheres of a constant size is obtainable if the volume of the material pieces is constant, even when the material pieces have irregular forms. The use of a wire as a blank material is therefore preferred because it enables an easy preparation of a large quantity of material pieces of a constant mass. Namely, a large quantity of material pieces of a mass can easily be prepared simply by cutting a wire at a constant pitch, provided that the wire has a constant cross-sectional area. The cross-sectional area is preferably minimized to minimize any fluctuation in the mass caused by error in the cutting length and, hence, to further enhance the dimensional precision.

(2) When a wire is used as the blank material, it is necessary that the ratio of the length of the chip cut from the wire to the cross-sectional size of the same is carefully selected because, when the ratio is too large, the chip may be divided into two metal spheres when molten by heating. Although the melt wire chip preferably has a large length while the cross-sectional size is minimized from the view point of the condition (1) above, it is preferred that the above-mentioned ratio falls within a certain range, considering the second condition, i.e., formation of one metal sphere from one wire chip. Through an intense study, the inventors have found that the tendency for the metal wire chip to be divided into two spheres is reduced to a satisfactory level when the length of the metal wire chip does not exceed 100 times the diameter of the same, when the blank wire has a circular cross-section. Taking into account also the dimensional tolerance, therefore, it is preferred that the ratio of the length to the diameter of the metal wire chip ranges between 5 and 100, and more preferably between 5 and 50.

(3) It is necessary that adjacent metal wire chips have to be spaced by a minimum distance during melting, for otherwise molten chips may merge in each other to form a greater spheres than expected. In addition, the metal wire chips may be deformed by application of heat. In order to avoid such a problem, it is necessary that the metal wire chips are spaced by a predetermined distance, hopefully 1 mm or greater.

(4) The surfaces of the metal wire chip may be oxidized or part of the chip may be dissipated by evaporation during the heating. This causes undesirable effect such as reduction of the yield due to contamination of the bump surface which is strictly required to be clean. It is therefore necessary to take a suitable anti-oxidation measure for certain kinds of metal. When the metal used has a high vapor pressure, it is also necessary that the melting is conducted in an atmosphere of an inert gas so as to prevent evaporation.

(5) The temperature to which the metal wire chip is heated only needs to be higher than the melting point. Heating to an unnecessarily high temperature is preferably avoided in order to prevent any change in the metal composition or degradation of the bump surface. The inventors have confirmed that the heating temperature is preferably 0° to 100° C. higher than the melting temperature of the metal. To be more precise, it is preferred that the heating temperature is selected to be low when the size of the metal sphere to be obtained is small. When heating to a comparatively high temperature is unavoidable, it is necessary to minimize the period in which the metal wire chip is held at such a high temperature, thereby preventing evaporation. In such a case, it is also preferred that the rate of cooling to re-solidification is increased to prohibit growth of coarse dendrite, thereby preventing degradation of the surface state.

BRIEF DESCRIPTION OF THE DRAWINGS

FIG. 10 is an illustration of a modification of the cutting operation shown in FIGS. 9a to 9f, obtained by replacing a part of the device of FIGS. 9a to 9f with an alternative;

FIG. 11 is a schematic illustration of another modification which employs feed rolls;

FIRST EMBODIMENT

Figure 1:
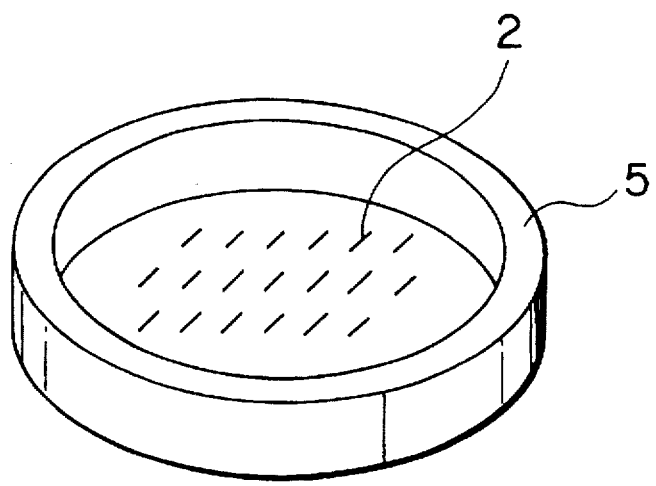
FIG. 1 is an illustration of a first embodiment of the method in accordance with the present invention, showing chips cut from a fine metal wire and arrayed on rows on a flat bottom of a crucible.
Figure 2A:
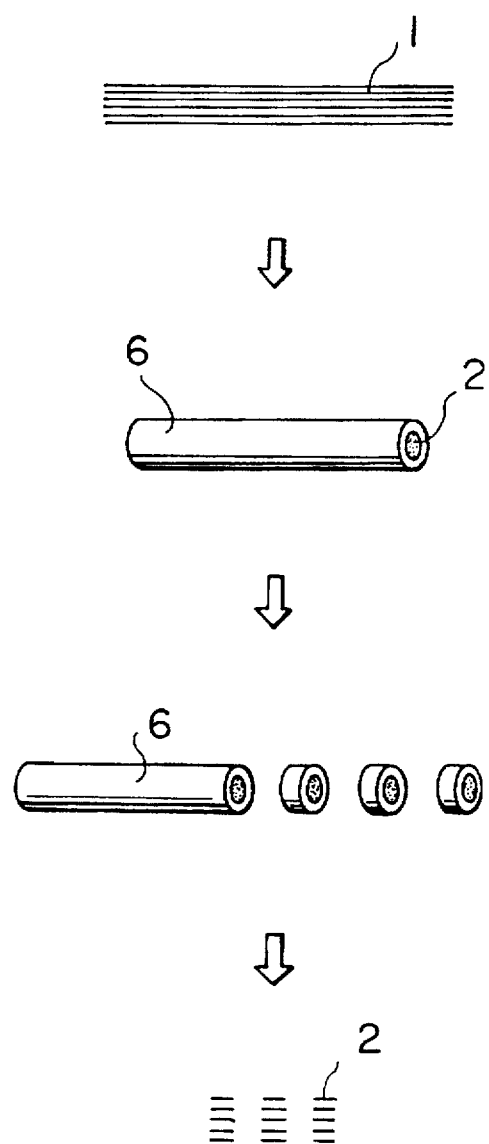
FIGS. 2A and 2B are illustrations of processes for cutting a wire into a large quantity of chips of a predetermined length.
Figure 2B:
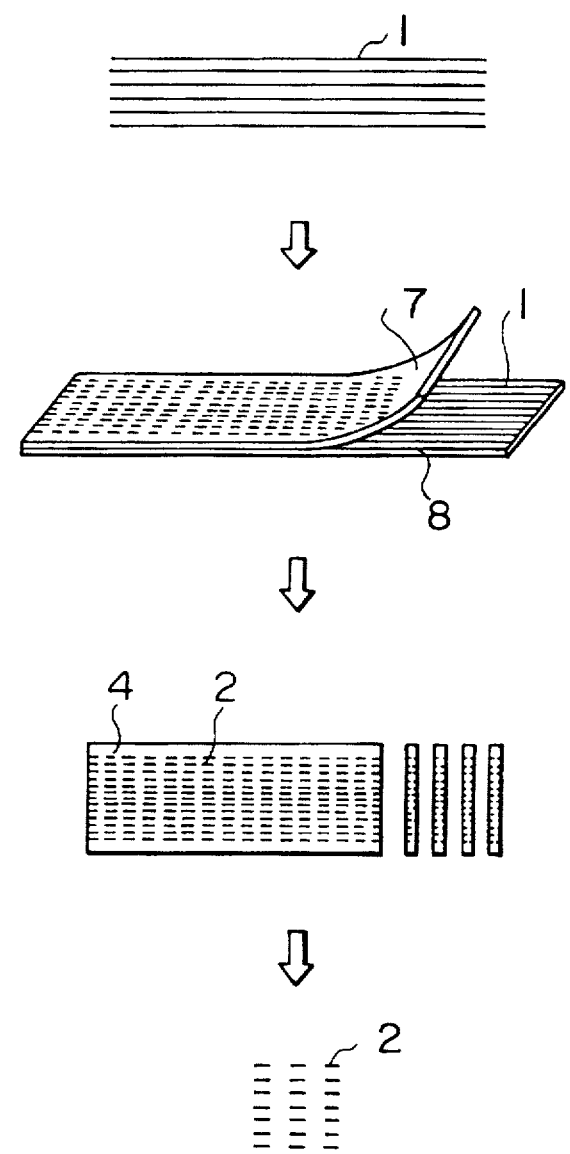

A first embodiment, which will be described with reference to FIGS. 2A and 2B, is effective in cutting a fine wire at a high precision without allowing any slack of the fine wire. More specifically, in the method shown in FIG. 2A, a bundle of tone metal wires is enclosed in a sheath 6 of a resin such as vinyl chloride. The bundle with the sheath is then cut into pieces of a constant length and then the sheath of each piece is broken, whereby metal wire chips 2 of a predetermined length are obtained. This method, however, involves a risk in that, when a too large number of wires are bundled, precision of the cutting length may be impaired due to bending or twisting of independent wires in the sheath. FIG. 2B shows a method in which a multiplicity of metal wires 1 are laid in parallel and sandwiched between two tapes 7 and 8, and this sandwich structure is cut at a predetermined width. Metal wire chips of a predetermined length are then obtained as the tapes are separated. In this method, at least one of the tapes should be an adhesive tape. The other tape need not always be adhesive. Namely, the covering tape may be a sheet of paper or the like. With this method, it is possible to obtain metal wire chips with an automatic cutting apparatus having a wide cutting blade. The metal wire chips 2 thus obtained are arrayed on a crucible 5 made of a material which is not reactive with the metal of the wire chips, as shown in FIG. 1. Fine metal spheres could be obtained with a high degree of uniformity in size, by heating these melt wire chips in the crucible.

Cutting of the metal wires into chips could be conducted with a very small error of ±0.1 mm or less by a commercially available automatic cutting device. Fine metal wire chips cut at the predetermined length were placed at a spacing greater than a predetermined limit value, in a crucible made of a material having a small wettability to the wire metal, e.g., graphite, and were heated in vacuum or an atmosphere of an inert gas. As a result of the heating, the wire chips were molten and became spheres due to action of the surface tension. After all the metal wire chips were molten, the spherical melts were cooled to solidify without loosing their spherical shapes, whereby the fine metal spheres as the product were obtained. Working Examples of the first embodiment are shown below.

WORKING EXAMPLE 1

Copper wires of 0.1 mm dia., i.e., 100 mm dia., were cut into wire chips of 0.7 mm long, and the fine copper wire chips thus obtained were placed on a flat bottom of a ceramics crucible at a pitch of 2 mm or so, followed by heating at 1120° C. in a vacuum furnace.

The copper spheres this obtained were measured. The spheres had a mean diameter of 0.22 mm, with the maximum and minimum diameters of 0.24 mm and 0.21 mm, thus proving a high degree of uniformity of the size.

WORKING EXAMPLE 2

Ten gold wires of 46 μm dia. were bundled and clad in a sheath of vinyl chloride as shown in FIG. 2A. A plurality of clad bundles of gold wire were chopped by an automatic cutter into pieces of 0.5 mm long. After the cutting, the sheath of vinyl chloride was removed and gold wire chips of an equal length were taken out. The gold wire chips thus obtained were laid in a graphite crucible having a flat bottom at a pitch of about 1 mm, and the crucible was put in a vacuum chamber for heating at 1080° C. by induction heating method.

About 9000 gold spheres thus obtained were sieved with a #120 mesh standard sieve (mesh aperture size 125 μm). All the gold spheres passed this sieve. The gold spheres were then screened through a sieve of #140 mesh (aperture size 106 μm). None of the gold spheres passed this sieve. Diameters of 100 spheres extracted from about 9000 spheres were measured. The mean diameter was 117 μm and the standard deviation was 1.9. From the results of the sieving and measurement, it is understood that the diameters of the gold spheres produced by this Working Example falls within a very restricted range between about 111 and 123 μm.

WORKING EXAMPLE 3

15 (fifteen) gold wires of 25 μm diameter were adhered to an adhesive tape of 18 mm wide in parallel and at a pitch of 1 mm, in a manner shown in FIG. 2B. A paper tape of the same width as the adhesive tape was adhered to the adhesive tape, such that the wires are sandwiched between the adhesive tape and the paper tape. This sandwich structure was sliced by an automatic slicer at a constant width of 0.55 mm. Thus, each slice of the sandwich structure had 15 gold wire chips of the constant length of 0.55 mm. The slices with the tapes were placed in a graphite crucible and heated at 500° C. in atmosphere to burn the tapes. Then, after changing the atmosphere to vacuum, the gold wire chips were heated to 1170° C. by induction hating. Numerous gold spheres with uniform size were thus obtained after removal of the residue of the burnt tapes. In Working Example 3, the heating was conducted in two stages. The first stage, which was conducted for the purpose of burning the tapes in atmospheric air at a low temperature, is not essential but is preferably adopted particularly in the case where the material metal has such a high reactivity as to react with the impurities in the tape material and to avoid any reaction between such impurities and the crucible surface.

Figure 3:
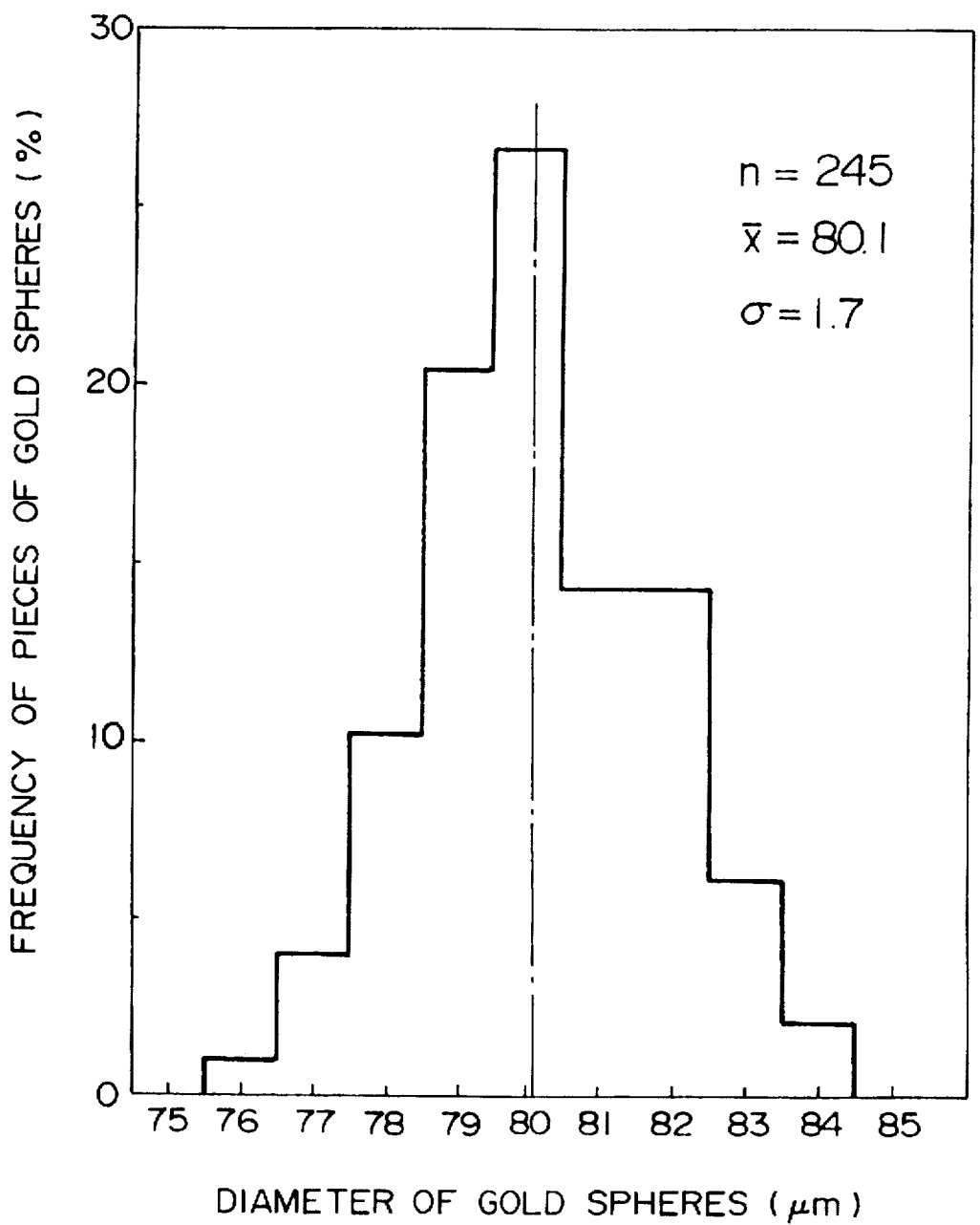
FIG. 3 is a graph showing distribution of sizes measured on metal spheres produced in accordance with the first embodiment.

Diameters were measured on 245 samples extracted from the gold spheres thus obtained, the result being shown in FIG. 3. It will be seen that the diameters of all the sample spheres ranged between 76 μm and 84 μm and the mean diameter is 80.1 μm with a standard deviation of 1.7, thus proving high degree of uniformity of the sphere size.

Metal spheres formed by conventional massproducing method have a wide size distribution. In order to select spheres of a specified range of size, therefore, it has been necessary to classify the spheres by, for example, sieving, so as to remove spheres which do not fall within the specified range of diameter. According to the first embodiment of the invention as described, it is possible to mass-produce, without requiring sieving, metal spheres with such a high degree of uniformity in size as to enable the spheres to be directly applied to uses which strictly require high dimensional precision, e.g., bumps, simply by cutting blank melt wires into chips exactly at a constant length. Furthermore, there is no restriction in the composition and purity of the metals which are encountered in the production of bumps by plating, thus allowing a wide selection of the metals and alloys in accordance with the nature or purposes of use of the spheres.

The present invention is basically intended for the production of metal spheres with high degree of uniformity of size. However, the invention can be applied to production of spheres of any desired size distribution, by providing a predetermined distribution of the cutting length.

SECOND EMBODIMENT

The first embodiment is very effective when an ultra-fine metal wire as a bump material is precisely cut by a known cutting device having a constant-pitch feeding mechanism. The first embodiment is suitable for small-scale productions.

In a second embodiment of the present invention which will be described hereinunder, a blank material of a soft metal such as gold, drawn to an ultra-fine wires of 50 microns or smaller diameter, is cut into a large quantity of chips of a constant length of 1 mm or less, preferably 0.6 mm or less, efficiently and with a high precision of cutting length, by using means which avoid any possibility of contamination of impurities such as adhesive components or components of arraying material.

Obviously, an efficient production of fine metal wire chips by cutting requires a simultaneous cutting of ultra-fine metal wires or, if only one wire is to be cut, a cutting method which provides an extremely high cutting speed. The second embodiment is based upon the first-mentioned method, i.e., simultaneous cutting of a plurality of ultra-fine wires bundled or arrayed in parallel. When a sheath, adhesive or tapes are used over the entire length of the ultra-fine wires for fixing these wires in parallel, the materials of the sheath, adhesive or tapes are concurrently cut to require a troublesome work for removing these inclusions. In order to eliminate this problem, the second embodiment makes use of an adhesive or tape which are applied only to both longitudinal ends of the parallel ultra-fine wires, so that no fixing material is applied to intermediate portions of the ultra-fine wires.

This method, however, excludes any cutting method which cuts the wires from one towards the other end. Namely, since the parallel arrangement of the ultra-fine wires is maintained by the supports at both ends thereof, the array will be loosened and when the wires are cut at one end. A similar problem is encountered when the flatness of the upper surface of the base plate is insufficient. The base plate, therefore, should be used in a clean state without any fine dust left on the upper surface thereof. In order to cut the ultra-fine metal wires into chips of a constant length while the wires are supported in such an unstable manner, it is desirable and effective that the cutting be conducted at once at all points where the cutting is necessary.

The second embodiment, therefore, is a result of a study for establishing a method which enables the cutting of intermediate portions of ultra-fine metal wires at once at all points where the cutting is necessary. As a result of the study, the inventors have found that such an object is easily attained by using a special cutting jig composed of a stack of cutting blades having disk-like or linear cutting edges. Namely, ultra-fine metal wires stretched on a flat base plate made of, for example, a hard rubber could be cut in a short time into chips of the desired length by means of a cutting jig having cutting edges which are arranged linearly at a constant pitch corresponding to the length of the chips to be obtained.

In this embodiment, attention must be paid to the following points.

It is necessary that the degree of parallel of the ultra-fine fibers laid on the flat base plate has to be sufficiently high to minimize error of the cutting length which may occur when the wires are not parallel. The cutting precision also tends to be impaired due to, for example, deformation at the cut edge, when the ultra-fine metal wires are placed in two or more layers on the base plate. Therefore, it is preferably avoided to stack to many ultra-fine metal wires. This applies also to the case where a plurality of ultra-fine metal wires are bundled.

In this embodiment, it is necessary that all the cutting edges are simultaneously brought into contact with the portions of the single ultra-fine metal wire along the length of the wire. If there is any difference in the timing of cutting by different cutting edges, the ultra-fine metal wire will undesirably spring when the wire is cut by the first cutting edge, so that subsequent edges cannot cut the wire precisely. It is, therefore, necessary that all the cutting edges are held at the constant level. When a cylindrical cutting jig is used, attention must be paid to keep the axis of the jig strictly in parallel with the stretched ultra-fine metal wire. When a flat tabular cutting jig is used, it is necessary that the plane formed by the ends of the cutting edges is held in parallel with the upper surface of the base plate or, at least, that the direction in which the edges of the cutting jig are arrayed in parallel to the longitudinal direction of the ultra-fine metal wires to be cut.

As the first step of this embodiment, the desired number of the ultra-fine metal wires to be cut are arrayed on a flat base plate. The fixing of these wires is done by applying an adhesive, tapes or sheaths only to both ends of these wires. Thus, the fixing means is not at all applied to intermediate portions of the ultra-fine wires. Consequently, the fixing material is not mixed in the ultra-fine wire chips after the cutting, thus eliminating any unfavorable effect which may otherwise be caused by impurities in the subsequent melting step.

Furthermore, since all portions of the intermediate parts of the ultra-fine metal wires to be cut are cut simultaneously by a jig having a plurality of disk-like or linear cutting edges, it is possible to obtain a large number of ultra-fine metal wire chips of the constant length simply by arraying the ultra-fine metal wires and fixing them only at their both ends.

Preferably, the flat base plate on which the ultra-fine metal wires are laid is made of a material having a fine structure and having a certain degree of elasticity, such as a hard rubber, plastics and so forth. The base plate made form such a material does not unnecessarily damage the cutting edges so that the cutting jig can stand a long use.

WORKING EXAMPLE 1

Figure 4:
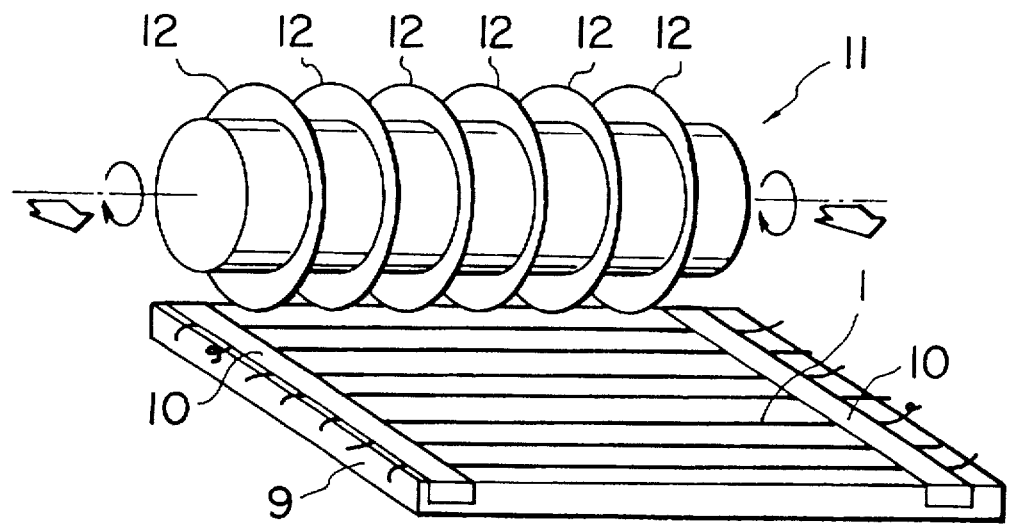
FIG. 4 is a schematic illustration of a cutting step in a second embodiment of the present invention.

FIG. 4 is a perspective view schematically showing a cutting operation conducted in accordance with this embodiment. Gold wires of 30 μm dia., used as the blank ultra-fine metal wires 1, were placed on a hard rubber plate serving as the base plate 9. These gold wires were fixed only at their both ends by means of adhesive tapes 10 bonded to the hard rubber plate. A cylindrical cutting jig 11, having a multiplicity of disk-like cutting edges 12 arranged at a pitch of 0.55 mm, was rolled on the top surface of the hard rubber from one end of the hard rubber plate towards the other end, whereby ultra-fine gold wires on the hard rubber plate were cut at a length of 0.55 mm.

The gold wire chips after the cutting were placed in a graphite crucible so as not to contact each other, and were high-frequency heated, whereby gold spheres for use as bumps were obtained with a high degree of uniformity in size and without any impurity.

WORKING EXAMPLE 2

Figure 5:
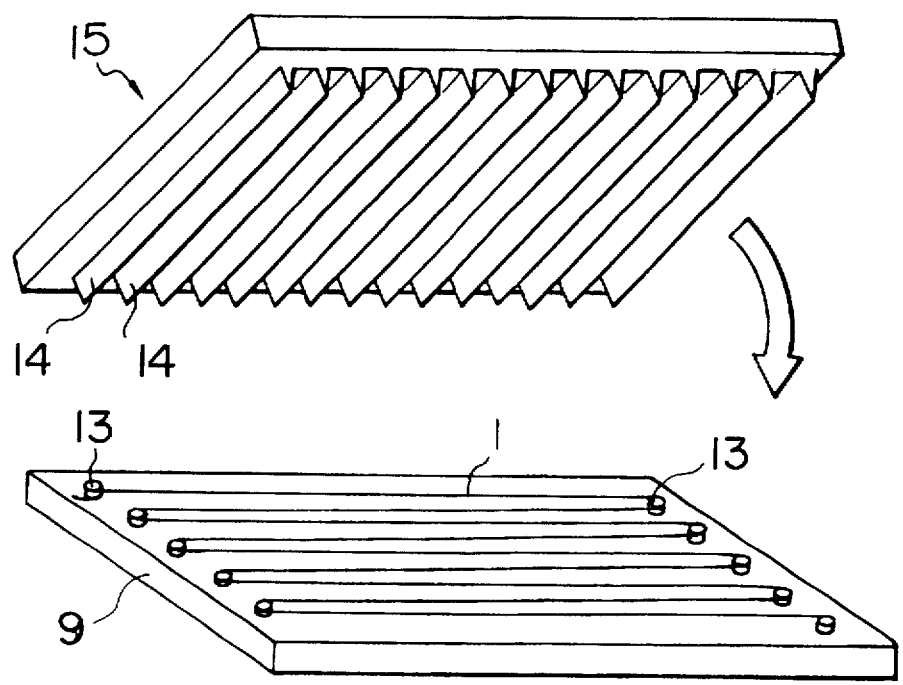
FIG. 5 is a schematic illustration of a modification of the second embodiment.

The concept of Working Example 2 will be described with reference to FIG. 5.

A plurality of small projections 13 were provided on both ends of a hard rubber plate used as the flat base plate 9. A continuous ultra-fine metal wire was stretched by being turned around the projections on alternating ends of the base plate 9, whereby a plurality of runs of the ultra-fine metal wires were arranged at a constant pitch. In this case, a gold wire having a diameter of 25 μm was used as the ultra-fine metal wire. A small amount of adhesive was applied to the portions of the ultra-fine gold turning around the projections so as to temporarily fix the wire. A cutting jig 15 was used in which a multiplicity of razor blades 14 were arrayed such that cutting edges of the blade form a flat plane. The cutting jig 15, while being held in horizontal posture, was moved downward onto the hard rubber plate 9 on which the gold wires 1 were stretched, whereby the ultra-fine gold wires were cut at plurality portions over the entire length substantially simultaneously. The gold wire chips after obtained as a result of the cutting were molten by the same method as the first working example, thus forming clean fine gold spheres suitable for use as bumps.

WORKING EXAMPLE 3

Figure 6:
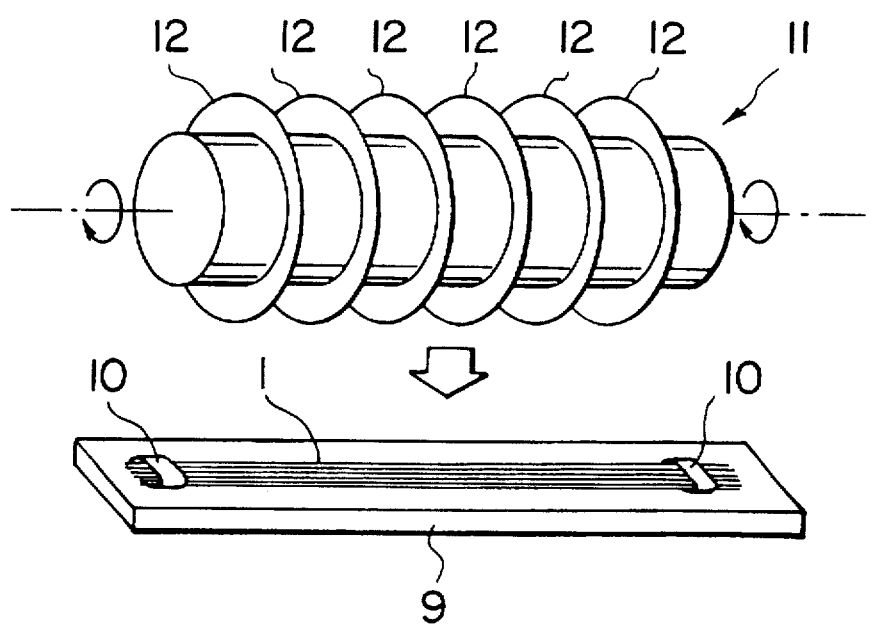
FIG. 6 is a schematic illustration of another modification of the second embodiment.

Referring to FIG. 6, a multiplicity of ultra-fine metal wires 1 (gold wires of 25 μm dia.) were bundled and fastened together at their both ends. The bundle was laid on a polypropylene plate serving as a flat base plate 9 without any slack. Both ends of the bundle fastened by adhesive were fixed to the base plate 9 by means of adhesive tapes 10.

A cutting jig 11 which is the same as that used in Working Example 1, i.e., jig having disk-like edges 12 arranged at a pitch of 1 mm, was rotated and lowered towards the polypropylene plate on which the bundle of the ultra-fine metal wires was fixed.

The gold wire chips obtained through the cutting were molten by the same process as the first embodiment, whereby fine gold spheres optimum for use as bumps were obtained.

Thus, in the second embodiment of the present invention, ultra-fine metal wire chips, suitable for use as the material of bumps used in, for example, the TAB method, can be obtained in a very large lot without mixing of impurities. In consequence, the troublesome work for removing impurities of ultra-fine metal chips before melting is eliminated to enable a very efficient production of bumps.

THIRD EMBODIMENT

This embodiment provides a cutting method in which fine metal wire chips of a constant length, which are to be molten to form bumps, can be cut from fine metal wires in a large lot by a cutting means which excludes any possibility of mixing of impurities such as components of adhesive or fixing material and which can supply the cut fine metal wire chips to a subsequent melting step without allowing these chips entangle with one another.

In a first cutting method used in this embodiment, a fine metal wire is fed through a guide having a minute inside diameter and, when the wire is fed out of the outlet end of the guide by a predetermined length, a cutting blade provided in the vicinity of the guide is activated to cut the fine metal wire.

In a second cutting method used in this embodiment, two types of guides are used: a guide X having an inside diameter just for allowing a fine metal wire to pass therethrough and a guide Y having an inside diameter slightly greater than that of the guide X. When a fine metal wire advanced through the guide X is received at its leading end by the guide Y by a predetermined length, a relative movement is caused between these guides so that a shearing is effected by the opposing edges of both guides, whereby the fine metal wire is cut.

This embodiment is intended for cutting fine metal wires having diameters 50 μm or smaller. The fine metal wire chips thus formed by cutting are arrayed in such a manner as not to be entangled with one another and are molten to form spherical bumps. The cutting step, therefore, should not be considered alone but should be considered from the view point of ease of melting in the next step.

In the melting step, attention must be paid above all to exclude any impurity, not only impurities which tend to be melt in the metal as the bump material but also impurities which tend to attach to the bump surfaces. Needless to say, such impurities should be removed before the metal chips are heated to a high melting temperature, rather than after the formation of the bump spheres.

In the method of the first embodiment for example, fixing means such as tapes are used for fixing the fine metal wires, a sorting operation has to be conducted before the melting for removing impurity sources such as the tape pieces after the cutting of the wires into fine metal wire chips, unless such impurity sources are of a type which can completely be extinguished by burning during the heating. Such a sorting operation is extremely difficult to conduct. It is therefore highly desirable that the cutting step is completed without using the impurity sources such as tapes and adhesive. It is also necessary that the independent metal wire chips are brought to the melting step without being interfered by one another. If a plurality of metal wire chips contacting one another are brought to the melting step, the melts of these chips will merge together to form large bumps which are practically unusable.

Thus, the third embodiment is mainly aimed at providing a cutting method for cutting fine metal wires in such a manner as to exclude mixing of impurities and, hopefully, to facilitate control of spacing of the metal wire chips falling into a receiver.

In order to achieve this aim, it is necessary that an independent fine metal wire, without any treatment, is cut at a high speed and the severed fine metal chips are evenly received by a receiver. By momentarily moving the receiver, it is possible to avoid concentration of the wires to local portions on the receiver.

The following two methods are conceivable as the method of cutting independent fine metal wires. In a first method, a guide is used which has a nozzle-like bore of a small diameter just for allowing the fine metal wire to pass therethrough. The fine metal wire fed through this guide is cut by a cutting tool which is disposed in the close proximity of the outlet of the guide. In a second method, the above-mentioned guide is used as a guide X, in combination with another guide Y having a bore slightly greater than the bore of the guide X. These guides are arranged to oppose each other and, when a fine metal wire fed through the guide X is received in the guide Y by a predetermined distance, a shearing is effected between the opposing edges of the guides thereby to shear the fine metal wire. The first method requires a cutting tool disposed on the outlet side of the guide. The cutting tool, preferably has a cutting blade of a very small thickness such as that of a razor since it is required to cut the wire into chips of an extremely small length. The material of the guide should be selected to enable the guide to stand a long use. In particular, in the second cutting method, it is preferred to use ceramics or a hard alloy because the cutting is effected by the shearing caused by the sliding between the ends of two guides.

The fine bore of the guide should have a diameter which is just for allowing the fine metal wire to pass therethrough. The clearance between the fine metal wire and the wall of the bore depends on the kind of the metal but should be on the order of several %. The diameter of the bore in the guide Y, however, is preferably determined to be about twice the diameter of the fine metal wire, in order that the leading end of the fine metal wire, which may have been deformed by the preceding cutting, can slide into the bore without being interfered by the brim of opening of this bore.

The fine metal wire is cut at a position in the close proximity of the guide, by the shearing effect produced by the cutting blade or the other guide. The cut wire chips are ejected separately and independently so that they can be delivered to the subsequent melting step in a good order.

WORKING EXAMPLE 1

Figure 7:
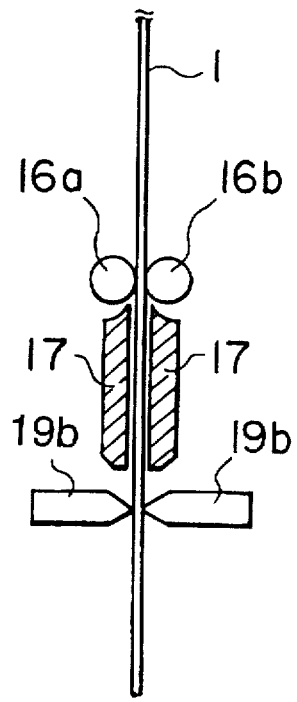
FIGS. 7, 8a and 8b are illustrations of a cutting operation in a third embodiment of the present invention.

FIG. 7 is a schematic illustration of a cutting method used in the third embodiment of the invention. A gold wire of 30 μm diameter was used as the blank fine metal wire 1. Grooved ceramic rolls were used as feed rolls 16a, 16b. These feed rolls 2a, 2b are driven by stepper motors (not shown) so as to advance the fine metal wire 1 through a fine bore in a guide 17 to a position where cutting blades 19a, 19b are stationed. The guide 17 was made of ceramics, while worked razor blades were used as the cutting blades. The length of each feed effected by the feed rolls is controlled by a driving unit (not shown) so as to be equal to the length of the cut metal wire chips to be obtained. In this Working Example, the driving unit was set to feed the wire at a pitch of 0.6 mm.

Needless to say, the cutting blades 5a and 5b are spaced apart from each other while the feed rolls are rotating to fed the fine metal wire 1. When one cycle of feed is completed, the cutting blades are activated to perform one cycle of cutting operation and then set again at the stand-by position. After the feed rolls conduct the next cycle of the feeding operation, the cutting edges are activated again to conduct the second cycle of the cutting operation. Cutting operation is thus conducted sequentially so that the cut fine metal wire chips are allowed to drop independently of one another.

In this Working Example, a graphite crucible with a flat bottom is placed at a position where it can receive the falling cut wire chips and the position of the crucible is momentarily shifted upon each receipt of a cut wire chip. The crucible on which the cut wire chips are placed can directly be put in a melting furnace, whereby bumps can be produced at a high efficiency.

In this Working Example, cutting is effected by a pair of cutting blades which pinch the wire from opposite sides thereof. This, however, is only illustrative and the cutting may be effected from one side of the wire by making use of a rotary blade.

WORKING EXAMPLE 2

The concept of the second cutting method used in the third embodiment will be described with reference to FIGS. 8a and 8b. This cutting method, for cutting a fine metal wire 1, employs feed rolls 16a, 16b and a guide 17 which are the same as those used in the first cutting method described in connection with Working Example 1. This Working Example features the use of a guide 18 in place of the cutting blades disposed under the guide 17 in Working Example 1. The fine metal wire 1 used in this Example had a diameter of 20 μm and the fine bore in the guide 17 had a diameter of 25 μm. The diameter of the bore in the guide 18 was 40 μm. Both guides were made of ceramics.

Figure 8A:
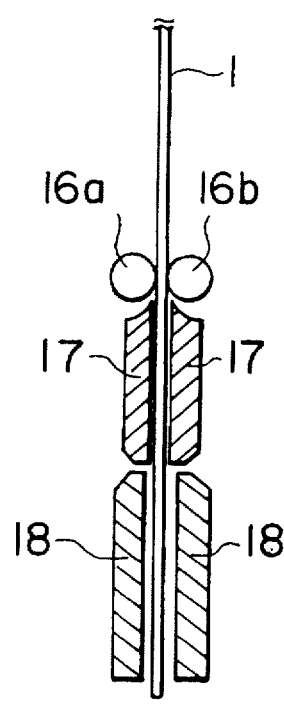
Figure 8B:
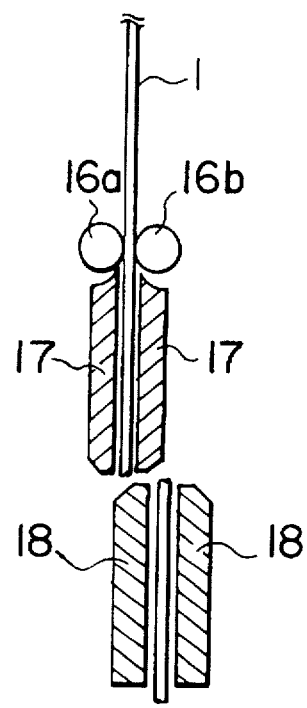

As the first step, the fine metal wire 1 is threaded both through the guide 17 and the guide 18, as shown in FIG. 8a. Then, the lower guide 18 is laterally moved by 0.5 mm relative to the guide 17, so that the fine metal wire is cut by shearing. After the cutting, the guide is -reset to the initial position and then the fine metal wire is fed by the feed rolls into the guide 18. As the fine metal wire is fed into the guide 4 by a predetermined length, the feed rolls are stopped automatically and then the guide 18 is laterally moved to cut the fine metal wire.

By this method, a fine metal wire could be cut into chips with a high degree of precision of the cutting length.

Thus, according to the third embodiment, it is possible to obtain fine metal wire chips which are to be molten to form bumps used in TAB method for example, in a large lot without allowing mixing of impurities, thus eliminating necessity for a work for removing impurities in advance of the subsequent melting step, while avoiding merging of a plurality of molten metal chips into a large sphere, thereby offering a highly efficient production of bumps.

FOURTH EMBODIMENT

This embodiment employs a cutting method which is different from that used in the third embodiment and in which a blank fine metal wire of a soft metal such as gold, which is drawn to a very small diameter of 50 microns or less suitable for production of bumps, is cut into a large number of chips of the desired length, at a high frequency and a high precision of cutting length, by cutting means which excludes any impurity such as components of adhesive or fixing material, while preventing mutual entanglement of the cut fine metal chips.

Two types of cutting methods are used. In a first cutting method, the leading end of a gripper which grips an end of the fine metal wire is moved to extract the wire from a guide by a predetermined distance and, then, cutting device provided in the close proximity of the gripper is activated to cut the fine metal wire.

In a second cutting method, a fine metal wire is extracted by a predetermined length from a guide by means of feed rolls which are arranged on the outlet side of the guide and, thereafter, a cutting device disposed in the close proximity of the feed rolls is activated to cut the fine metal wire.

This embodiment features a specific way of cutting, the cut metal wire chips are arrayed in such a manner as not to interfere with one another and then delivered to the melting step to become spherical bumps. Thus, the cutting conditions should be considered not on the basis of the cutting operation alone but should be considered also from the view point of ease of the subsequent melting operation.

This embodiment, therefore, is aimed at providing a cutting method which meets the first requirement of exlusion of mixing of impurities and the second requirement for prevention of entanglement of the cut metal wire chips, in such a manner as to facilitate the control of spacing of the cut metal wire chips fallen on the receiver. To achieve this aim, it is necessary that an independent bared fine metal wire is cut bit-by-bit and the cut metal wire chips thus formed successively are processed one by one.

A metal wire of an ordinary diameter can easily be cut into a multiplicity of chips of a constant length, by intermittently pushing the wire by feed rollers and activating a cutting device in each interval of the feed. In case of a fine metal wire having an extremely small diameter, however, the feeding precision itself tends to be impaired due to flexing of the wire pushed by the feed rolls. It has become clear that this problem can be overcome by extracting the wire through a guide. The following methods were found effective for intermittently extracting a fine metal wire at a constant pitch.

The first method employs a holding means such as a gripper which grips part or whole of the leading end portion of the fine metal wire which is to be severed. The holding means is moved away from the guide by a distance corresponding to the length of the metal wire chips to be severed, thereby extracting the fine metal wire. The second effective method employs feed rolls arranged at the outlet side of the guide. The feed rolls are driven by, for example, stepper motors one step of which corresponds to the length at which the fine metal wire is to be cut. According to these methods, troubles such as bending of the fine metal wire, which is caused when the fine metal fire is fed by pushing forward, is eliminated. In addition, a tendency for the fine bore of the guide to be clogged with the fine metal wire is greatly suppressed.

Mechanisms for extracting a fine metal wire at a constant pitch are thus realized. The inventors have conducted a study to find a cutting method suitable for combination with the described feeding method. In order to attain a high precision of the cutting length, it is necessary that the cutting blades are activated while the portion of the wire as near as possible the cutting blades is firmly fixed. If the wire is fixed at a position spaced from the cutting blades, the fine metal wire is largely moved by the movement of the blade itself, with the result that the cutting precision is impaired correspondingly. In addition, the fixing portion should be determined to be as close as possible to the end of the fine metal wire. Further it is preferred to grasp an extreme end of the fine metal wire, which is going to be severed, at the outside position of the blade rather than a position intermediate between the guide and the cutting blades. In such a case, the portion of the fine metal wire, which has been deformed by the gripper, is severed off the wire and the gripper can grip a new portion of the wire which has not been substantially affected by the previous gripping and cutting. Such an arrangement of the holding means, therefore, remarkably enhances the reliability of an automatic system which performs the method of this embodiment.

The fine metal wire to be cut is intermittently extracted from the outlet side of the guide. The length of extraction in each extracting cycle corresponds to the length of the cut metal wire to be obtained. The extraction is conducted by the feed rolls or the holding means provided on the outlet side of the guide. The cutting is conducted by cutting blades which are arranged in the close proximity of the feed rollers or holding means. Cutting operation suitable for mass-production was successfully executed without causing any bend of the fine metal wire in the guide bore or clogging of the bore by the wire, by virtue of the fact that the fine metal wire was extracted from the outlet side of the guide rather than by being pushed into the tiny guide bore.

WORKING EXAMPLE 1

FIGS. 9a to 9f schematically show basic operation of this embodiment. A gold wire of 20 µm dia. was used as the fine metal wire 1. The fine metal wire 1 is extracted downward through a guide 20 made of quartz and having a bore of a diameter of 30 µm. The leading end of the fine metal wire 1 reaches the space between the cutting blades 19a, 19b which are in separated state past the space between holding members 21a, 21b which also are in the separated state. A damper denoted by 22a, 22b is disposed at the inlet side of the guide 20 so as to prevent the fine metal wire 1 moving naturally into the guide 20 (see FIG. 9a).

Figure 9A:
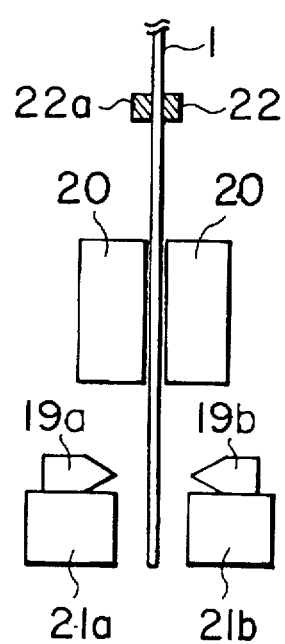
FIGS. 9a to 9f are illustrations of a cutting operation in a fourth embodiment of the present invention.
Figure 9B:
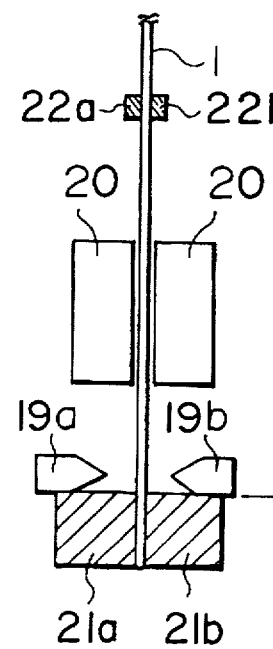
Figure 9C:
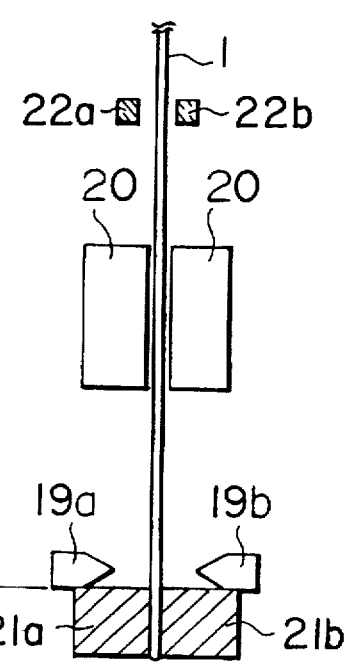

As the first step of the operation, the holding members 21a, 21b made of ceramics, were brought together to pinch and fix the fine metal wire 1 from both sides thereof (see FIG. 9b). Subsequently, the damper 22a, 22b was moved apart and the holding members 21a, 21b gripping the fine metal wire 1 were moved downward by a distance d. Razor blades were used as the cutting blades 19a, 19b. The cutting blades 4a, 4b were so constructed that they moved vertically as a unit with the holding members 21a, 21b. Thus, the cutting blades 19a, 19b were moved downward by the distance d as a result of the above-mentioned downward movement of the holding members 19a, 19b (see FIG. 9c). As a result of the above-described operation, the fine metal wire was extracted by the length d from the guide 20.

Figure 9D:
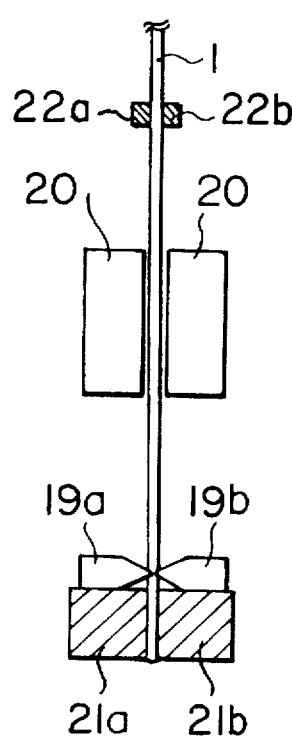
Figure 9E:
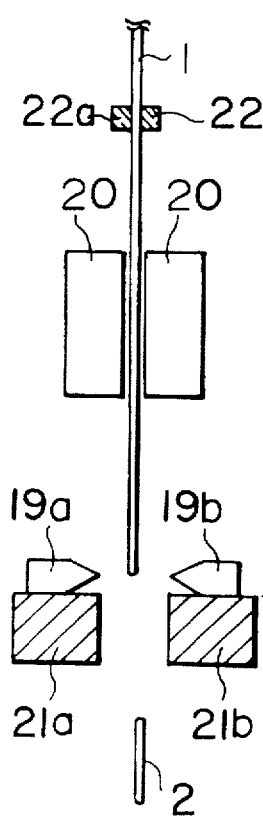
Figure 9F:
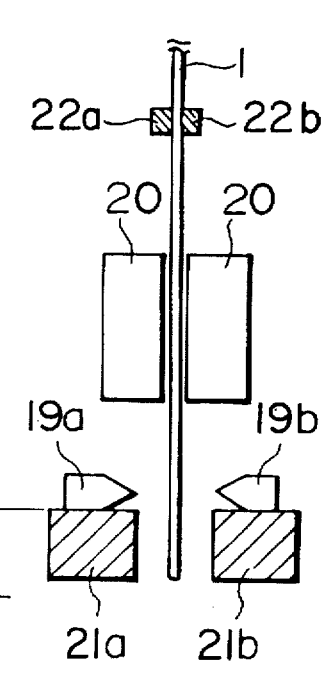

The damper 22a, 22b was then closed and the cutting blades 19a, 19b were activated to move horizontally to cut the fine metal wire 1 (see FIG. 9d). The cutting blades 19a, 19b were reset to the waiting positions immediately after the cutting and the holding members 21a, 21b were moved apart so as to release the fine metal wire 1 thereby allowing the severed wire chip 2 to drop (see FIG. 9e). Finally, the holding members 21a, 21b and the cutting blades 19a, 19b were moved upward as a unit by a distance d (see FIG. 9f), thus recovering the initial state shown in FIG. 9a. It is thus possible to successively severe wire chips of a constant length d by cyclically conducting the steps shown in FIGS. 9a to 9f. Tests were conducted by employing different distances d, i.e., 0.3 mm, 0.5 mm and 0.8 mm. In each case, the cutting could be done with a small error within ±0.1 mm.

WORKING EXAMPLE 2

In Working Example 1 described above, the clamper 22a, 22b has a role to prevent the fine metal wire from being naturally moved into or out of the guide when the holding members 21a, 21b which clamp the fine metal wire at the guide outlet are set to the releasing positions. This role, however, may be performed by a suitable means other than the damper used in Working Example 1.

In Working Example 2, the guide 23, shown in FIG. 10, has a spiral form so as to play also the role of the clamper. The holding members 21a, 21b and the cutting blades 19a, 19b were the same as those used in Working Example 1. According to this arrangement, a certain resistance is produced by the wall of the spiral guide 23 when the fine metal wire 1 is fed through the guide 23, so that the extracted fine metal wire is stationed at the extracted position. Consequently, cutting was effected with a high precision as in Working Example 1, despite the absence of the clamper.

WORKING EXAMPLE 3

FIG. 11 is a schematic illustration of the apparatus used in this Example. Numeral 1 denotes a fine metal wire. 20 denotes a guide, 21a, 21b denote holding members and 19a, 19b denote cutting blades. Feed rolls 16a, 16b were placed on the outlet side of the guide 20. The feed rolls 6a, 6b made of ceramics and having a diameter of 3 mm, were placed at a position which is 10 mm spaced from the outlet end of the guide 20. The feed rolls were driven by stepper motors which are not shown, so as to intermittently extract the fine metal wire at a constant length from the outlet end of the guide 20. In this Working Example, the portion of the fine metal wire to be cut is automatically moved to the position of the fine metal wire, so that there is no need for the holding members 21a, 21b and the cutting blades 19a, 19b to be moved vertically. The feed rolls rotate by an angle corresponding to one step so as to extract the leading end portion of the fine metal wire 1, while both the holding members 21a, 21b and the cutting blades 19a, 19b are in their spaced positions. Then, the holding members 21a, 21b are brought together to fix the end of the fine metal wire and then the cutting blades 19a, 19b are moved horizontally thereby cutting the fine metal wire 1. Cutting could be done by this method with a high degree of precision, when conducted on a gold wire of 30 μm dia. as the fine metal wire 1 at a cutting length of 0.4 mm.

WORKING EXAMPLE 4

Figure 12:
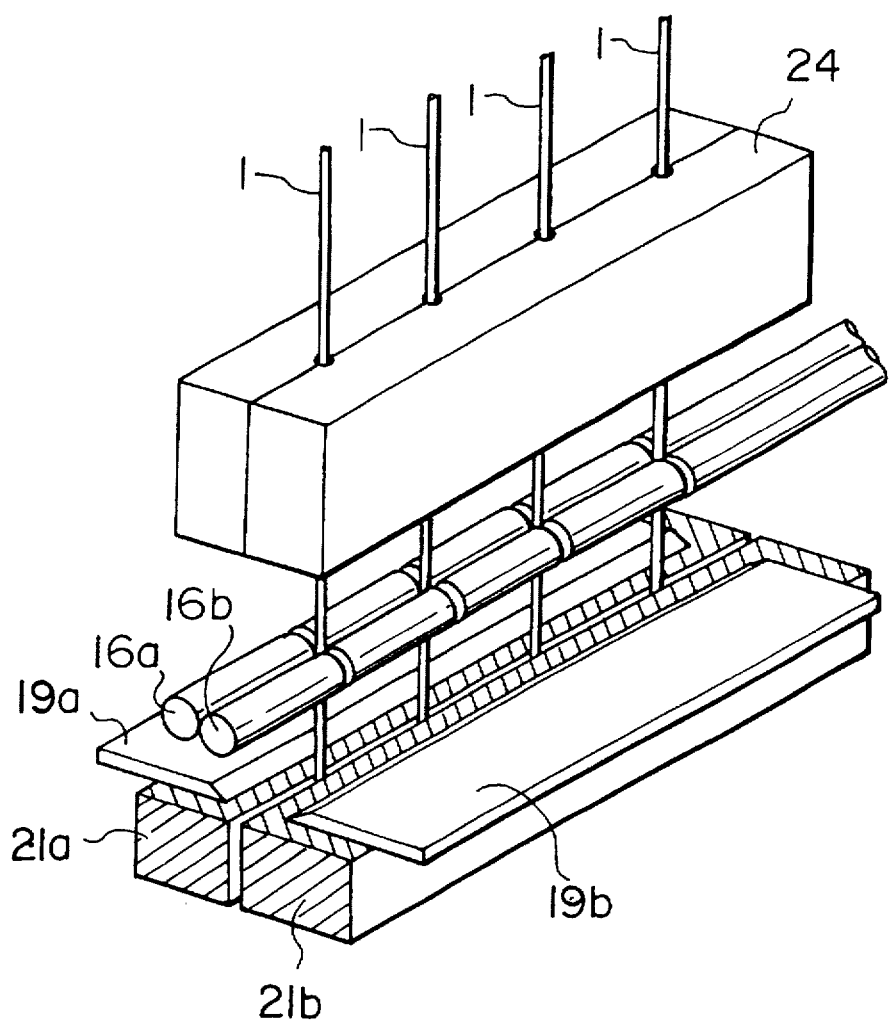
FIG. 12 is an illustration of a further modification which is improved to provide a higher cutting efficiency.

The method of the fourth embodiment is for cutting an independent fine metal wire at a high precision. In order to improve the cutting efficiency, it is possible to combine a plurality of cutting elements for a plurality of independent wires so as to simultaneously process the wires in a parallel fashion. FIG. 12 shows an example of such a system, arranged for simultaneously cutting four fine metal wires. The guide 24 used in this Working Example is made of ceramics and has a split-type construction composed of two halves having complementary grooves which in cooperation define a passage for the fine metal wire when these halves are brought together. The feed rolls 16a, 16b also are made of ceramics and are grooved to guide the fine metal wire straight. The rolls are driven by stepper motors which are not shown so that four fine metal wires 1 having an equal length are extracted as one.

The holding members 21a, 21b, as well as the cutting blades 19a, 19b, can simultaneously act on the four fine metal wires. The feed rolls are rotated while the wires are freed from the holding members and the cutting blades, thereby extracting the fine metal wires by a predetermined length. Then, the holding members are actuated to fix the ends of the fine metal wires, followed by activation of the cutting blades 19a, 19b for cutting the fine metal wires.

Gold wires of 20 m dia. were uniformly cut into wire chips of 0.9 mm long by the described method.

According to this embodiment, fine metal wires can be cut precisely without causing the fine metal wires to contact any impurity. In addition, the cut wire chips can be taken out in a separated state, thus facilitating delivery to the subsequent melting step.

FIFTH EMBODIMENT

Materials of bumps are mainly soft metals. Wires formed from a bump material are generally so flexible that it is undesirably bent by the force of gravity, making it difficult to handle. In order to enhance the precision of the cutting length, it is necessary that the flexural metal wire be fed precisely at a predetermined pitch. It is, however, extremely difficult to precisely feed a fine metal wire of a soft metal having an extremely small diameter of several tens of microns and about 10 microns at the smallest.

The fifth embodiment has been accomplished in view of the above-described problem. Thus, the fifth embodiment provides a method which enables a fine metal wire to be cut efficiently and precisely into wire chips of a predetermined length and which is different from those used in the first to fourth embodiments.

The method of the fifth embodiment has the steps of: providing a first roll having a plurality of cutting edges formed at a constant circumferential pitch, a second roll contacted by the first roll, and a guide portion between the first and second rolls for cutting a fine metal wire; and rotatingly driving at least one of the first and second rolls so as to clamp and pull the fine metal wire into the nip between the first and second rolls, thereby cutting the fine metal wire by the cutting edges.

The second roll may have an outer peripheral surface region made of an elastic material.

In this embodiment, the fine metal wire guided by the guide portion is clamped by and pulled into the nip between both rolls, so that the wire can be precisely advanced even when it is highly flexible. In addition, it becomes possible to cut the fine metal wire precisely into metal wire chips of a predetermined length by designing the first roll such that the pitch of the cutting edges is equal to the cutting length. The second roll, when provided with a peripheral surface region made of an elastic material, can grip and pull the fine metal wire with enhanced frictional force.

WORKING EXAMPLE 1

Figure 13:
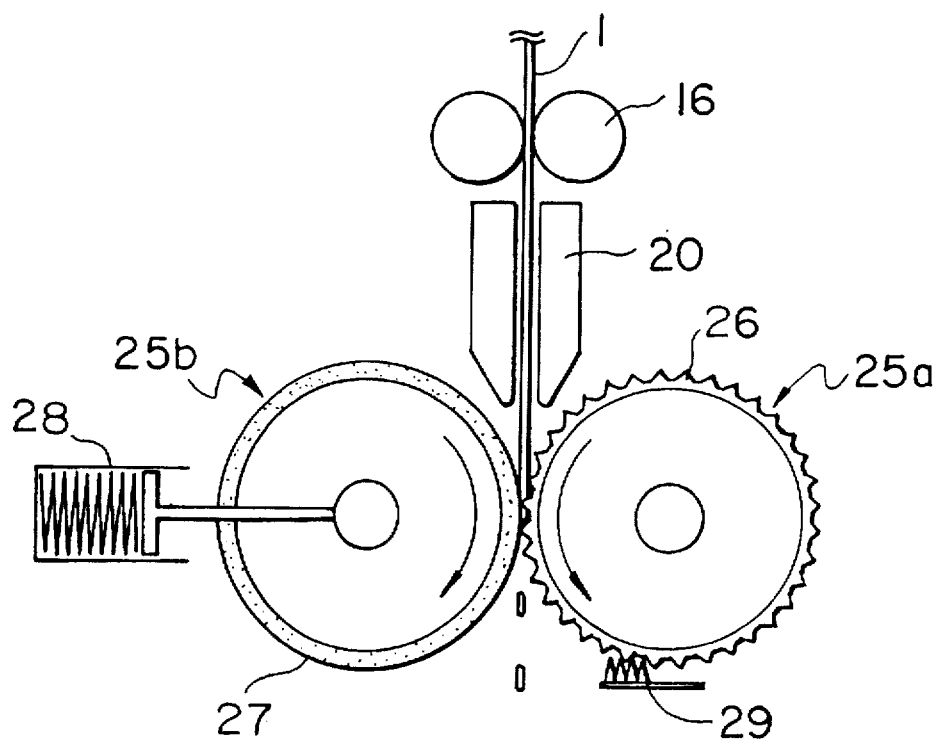
FIG. 13 is a schematic illustration of a cutting device used in a fifth embodiment of the present invention.
Figure 14:
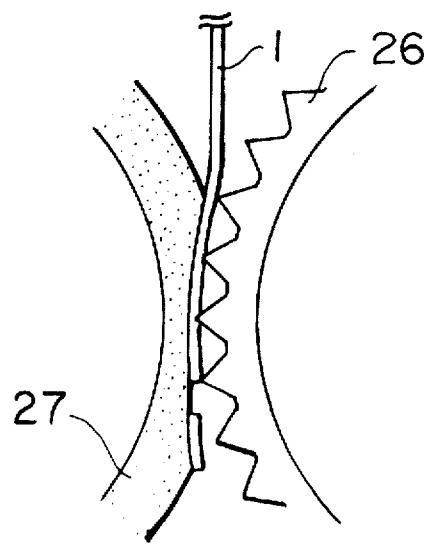
FIG. 14 is a schematic fragmentary enlarged view of the cutting device of FIG. 13, showing particularly a cutting roller cutting a fine metal wire.

The fifth embodiment of the present invention will be described in more detail with specific reference to FIGS. 13 and 14. FIG. 13 is a schematic illustration of an arrangement for conducting cutting step for cutting a fine metal wire in the fifth embodiment, while FIG. 14 is a schematic enlarged view of rollers during cutting of a fine metal wire by the cutting arrangement shown in FIG. 14. In this embodiment, gold wire of 20 μm diameter is used as the fine metal ire.

The cutting step for cutting a fine metal wire in the Working Example 1 is conducted by a cutting arrangement which includes feed rolls 16 for feeding forward the fine metal wire 1, a guide 20 made of quartz and having a fine bore of 30 μm dia. and a pair of rolls 25a, 25b arranged below the guide 20.

A metallic cutting roll 25a (first roll) has a multiplicity of cutting edges 26 which are arranged at a constant circumferential pitch as shown in FIG. 13. The pitch of the cutting edges 26 is determined by the size of spherical bumps to be obtained and the diameter of the fine metal wire used as the material. In this Working Example, the pitch of the cutting edges is set to be 0.85 mm, in order to form spherical bumps of 80 μm diameter from a gold wire of 20 μm in diameter.

The pressing roll (second roll) 25b has an outer peripheral surface region made of an elastic material denoted by 27. This elastic material is used in order to increase the frictional attraction force so as to easily and securely attract the fine metal wire 30. The pressing roll 25b is provided with a cutting load adjusting mechanism 25. This mechanism is adapted for adjusting the pressure of contact between the cutting roll 25a and the pressing roll 25b. The axial thickness of the rolls 25a, 25b (measured in the direction perpendicular to the drawing sheet of FIG. 13) may be as small as about 2 since the diameter of the fine metal wire is very small. The diameters of these rolls 25a, 25b may be about 10 mm or so.

In general, cutting of a fine metal wire into chips of a predetermined length by feeding the wire forward by feed rolls alone encounters a problem in that the feed cannot be conducted at a high precision due to bending of the fine metal wire. The feed rolls 16 of Working Example 1 are intended for initially loading the guide portion 20 with the fine metal wire 30 in the initial setting of the apparatus.

Thus, the feed rolls 16 merely support the fine metal wire 1 and do not positively feed the same during operation of the apparatus. In this Working Example, the extraction of the fine metal wire 1 is effected by the pair of rolls 25a, 25b as will be understood from the following description. Thus, the feed rolls 16 are not indispensable.

For cutting the fine metal wire 1 by the arrangement of Working Example 1, the leading end of the fine metal wire 1 is threaded through the nip between the feed rolls 16 and the feed rolls 2 are driven by, for example, stepper motors which are not shown, so that the fine metal wire 1 is introduced into the minute bore in the guide 20. The fine metal wire is therefore guided into the nip between both rolls 25a, 25b through the guide 20. Subsequently, both rolls 25a, 25b are driven by a driving device which is not shown. Consequently, the fine metal wire 1 is clamped by and attracted into the nip between the rolls 25a, 25b. In this Working Example, the outer peripheral region of the pressing roll 25b is formed of an elastic material 27, so that the fine metal wire can be clamped and attracted without any risk of breakage. In addition, a large frictional attraction force is developed to pull the fine metal wire into the nip between these rolls 25a, 25b so that the fine metal wire 1 can be fed precisely without any slip. When the fine metal wire 30 has reached a position on a line which interconnects the centers of both rolls 25a, 25b the force exerted by the cutting edge 26 on the fine metal wire 1 and the elastic material is maximized so as to cut the fine metal wire 1. It is thus possible to pull the fine metal wire 1 and cut the same precisely at a constant pitch (pitch of the cutting blades), simply by driving the rolls 25a, 25b.

The described Working Example 1 employs a cleaning device 29 having a brush or a nozzle and disposed under the cutting roll 25a. The cleaning device 29 removes any residue of the metal, e.g., gold, accumulated on the cutting edges 26 during continuous cutting, thereby preventing the cutting edges from becoming dull, thus ensuring high cutting precision while avoiding any inferior cutting.

According to the described Working Example 1, one (shown by 25b) of the roll has a peripheral surface region made of an elastic material, while the other roll 25a has cutting edges arranged at a constant pitch. It is therefore possible to stably attract the fine metal wire into the nip between these rolls by the frictional force and to cut the into chips of a constant length with a high precision. In addition, the length of cutting of the fine metal wire can be varied by varying the pitch of the cutting edges. In addition, the speed of cutting of the fine metal wire can be increased since the mechanical action is only to rotatingly drive the rolls.

The metal wire chips formed by the process of Working Example 1 are molten in the subsequent melting step so as to be formed into spherical bumps. In the melting step, it is necessary that the independent metal wire strips are molten without being interfered by one another.

When the described process for cutting the fine metal wires is adopted, the severed metal wire chips are allowed to drop onto a conveyor device such as a conveyor (not shown) disposed beneath the rolls, so that the severed metal wire chips are successively arrayed on the conveyor at a substantially constant interval, thus enabling a continuous supply of the wire chips from the cutting step to the subsequent melting step.

WORKING EXAMPLE 2

Figure 15:
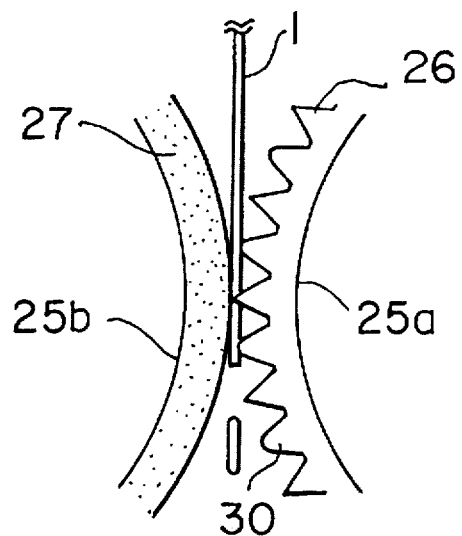
FIG. 15 is an enlarged schematic illustration of a roller in a modification of the cutting device used in the fifth embodiment.

FIG. 15 is a schematic enlarged view of rollers cutting a fine metal wire in accordance with a cutting method of a Working Example 2 of this embodiment. The Working Example 2 is distinguished from the Working Example 2 in that the cutting roll 25a of the Working Example 2 is provided with pressing teeth 30 arranged alternately with the cutting edges 26. Each pressing tooth 30 has a rounded edge which serves to attract the fine metal wire 1 in cooperation with the elastic member 27. In the Working Example 2, therefore, it is possible to clamp and attract the fine metal wire 1 with a greater frictional force than in the Working Example 1, by virtue of the cooperation between the rounded pressing teeth 30 and the elastic material 27.

From the view point of the production of the pressing roll 25b, it is not easy to realize such a small pitch of cutting edges 26 as in Working Example 1, because the cutting edges 26 are formed alternately with the pressing teeth 30. The Working Example 2, therefore, is suitable for use in the case where the fine metal wire 1 is cut at a comparatively large cutting pitch. For instance, when spherical bumps of a diameter around 120 μm are to be formed, the fine metal wire 1 should be cut at a pitch of 2.8 mm if the diameter of the wire 1 is 20 μm as in the case of Working Example 1. The cutting rolls 25a having such a comparatively large pitch can be produced without difficulty. Other points of operation and advantages are the same as those of Working Example 1.

WORKING EXAMPLE 3

Figure 16:
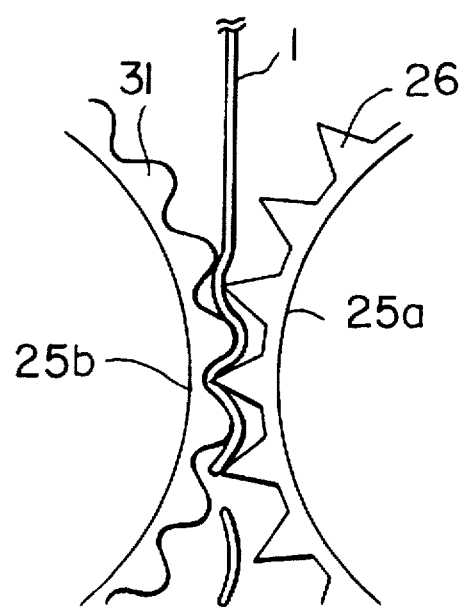
FIG. 16 is an enlarged schematic illustration of a roller in another modification of the cutting device used in the fifth embodiment.

FIG. 16 is a schematic enlarged view of rolls cutting a fine metal wire in accordance with a cutting step of Working Example 3 of this embodiment. The Working Example 3 is different from Working Example 1 only in that the outer peripheral surface of the pressing roll 25b is corrugated to provide pressing teeth 31 so that the fine metal wire 1 can be attracted into the nip between the rollers 25a, 25b by a greater frictional traction force than in Working Example 1. In Working Example 3, the rollers 25a and 25b are rotated with the corrugated pressing teeth 31 meshing with the cutting edges 26, so that the arc length of the tooth 31 determines the length of cutting of the fine metal wire 1. The corrugated pressing teeth 31 may be made of an ordinary metal or of an elastic material.

In the cutting step for cutting fine metal wire in Working Example 3, the fine metal wire 1 is pulled into the nip between the rolls along an arcuate path. This Working Example is therefore suitable for use in the cases where materials which are flexural but resistant to tearing when flexed, e.g., copper, are used as the materials of the fine metal wires 1.

In the foregoing description of Working Example 3, the cutting operation was explained with reference to a case where a single fine metal wire is cut. This, however, is only illustrative and the described Working Example may be modified to cut two or more fine metal wires simultaneously. Needless to say, in such a modification, it is necessary to correspondingly increase the axial thicknesses of the rolls.

As has been described, in the fifth embodiment of the present invention, it is possible to continuously cut a fine metal wire with a high degree of precision of the cutting length by a simple mechanism including a pair of rolls one of which is provided with peripheral cutting edges formed at a predetermined pitch. It is thus possible to obtain a cutting method for cutting fine metal wire, capable of improving the production efficiency.

SIXTH EMBODIMENT

In the first embodiment described before, the spheroidizing step which is the second critical feature of the method of the present invention is conducted by arraying the fine metal chips cut in a constant length from the bump material wire with suitable spacing from one another, melting the wire chips and then solidifying the same so as to form spherical bumps by making use of the surface tension of the melt.

Thus, in the first embodiment of the method of the present invention for producing fine metal spheres, the chips of a constant length cut from a fine metal wire are arrayed on a crucible at a predetermined spacing and are molten in this state. This constant spacing is necessary to avoid merging of melts of adjacent cut wire chips which may occur when the melting step is conducted without leaving sufficient space between adjacent cut wire chips. This method can produce fine metal spheres with a high degree of uniformity of size provided that the chips are cut from the fine metal wire at a constant length. The metal wire chips, however, are very minute, 2 to 3 mm in length at the greatest, so that laborious work is necessary for arraying these chips, as well as for collecting the formed fine metal spheres.

In view of this fact, a sixth embodiment of the present invention provides a spheroidizing step which can improve the efficiency of the work with a simple device.

The spheroidizing step adopted in the sixth embodiment is characterized by the use of a vertically oriented furnace core tube arranged in the heating means. The cut metal wire chips are allowed to freely fall through the furnace core tube so as to be heated to a temperature above the melting point, whereby the metal wire chips are molten and spheroidized. Preferably, a lid is provided on the bottom of the reactor core tube.

According to this arrangement, a heating means heats the metal wire chips to a temperature above the melting point thereby melting these chips while the chips are freely falling in the furnace core tube. The metal in molten state exhibits a large surface tension so as to be spheroidized by itself, so that the metal wire chips are formed into fine metal spheres during dropping freely through the furnace core tube.

The lid on the bottom of the furnace core tube effectively prevents generation of an ascending flow of air through this tube.

Figure 17:
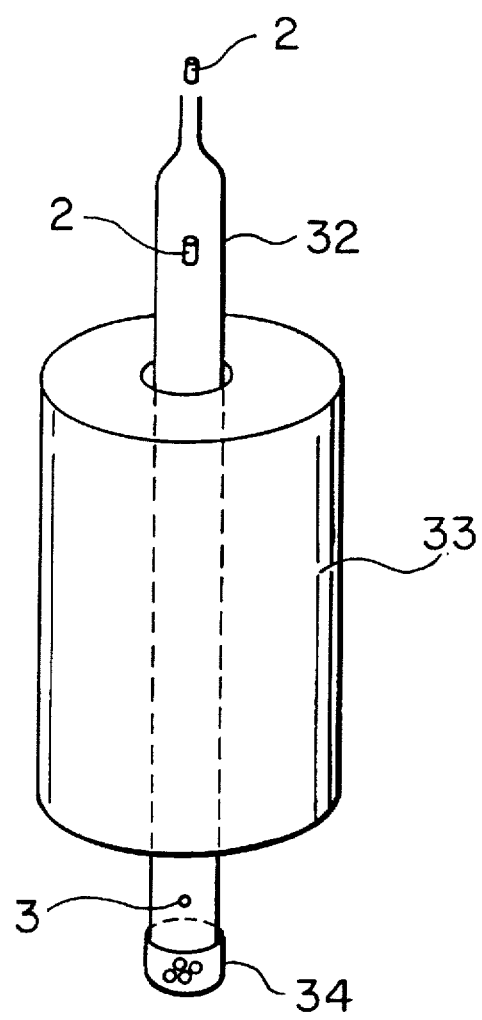
FIG. 17 is a schematic illustration of a device which is used in a heating step in a sixth embodiment of the present invention.

A working example of the present embodiment will be described below with reference to the accompanying drawing. FIG. 17 is a schematic diagram of an apparatus used in this working example. In this working example, a gold wire chip (metal wire chip) having a wire diameter of 25 µm, and a length of 0.55 is used and a gold sphere (fine metal sphere) having a diameter of 80 µm is manufactured.

The apparatus shown in FIG. 17 has a furnace core tube 32 serving as a passage through which a metal wire chip 2 falls, a heating furnace 33 for melting the metal wire chip 2, and a lid 34 for collecting fine metal spheres 3 formed. A quartz glass having an inside diameter of about 5 mm and a length of about 1000 mm was used as the furnace core tube 32, and a vertical ring type electric furnace having a length of 500 mm was used as the heating furnace 33. The heating furnace 4 had a temperature distribution such as to have a maximum temperature in the vicinity of its lower end. The maximum temperature in the heating furnace 33 was 1300° C. The maximum temperature of the heating furnace 33 was set to be higher than the melting point of gold in order to positively heat up the metal wire chip freely falling to a temperature higher than the melting point. The lid 34 is formed of quartz glass and is fitted to the lower end of the furnace core tube 2. The lid 34 serves to present occurrence of an upward air flow caused by the high-temperature heating furnace 33 and to collect fine solidified metal spheres. The distance between the heating furnace 33 and the lid was about 200 mm. Ordinary atmosphere air was supplied to the interior of the furnace core tube 32.

A metal wire chip 2 cut by a fine metal wire cutter (not shown) was made to fall from above the furnace core tube 32 to enter the furnace core tube 2. When the metal wire chip 2 entered the heating furnace 33 by falling in the furnace core tube 32, the temperature of the metal wire chip 2 was abruptly increased. The metal wire chip was melted when the temperature thereof became higher than the melting point of the metal. Ordinarily, metals change in shape in a molten state to become spherical by themselves because the surface tension thereof is large. The shape of the molten metal was therefore changed into a spherical shape during passage through the heating furnace 33. When the molten metal came out of the heating furnace 33, the temperature was abruptly reduced and the metal started solidifying. Finally, a metal sphere fell to the lid 34. Fine metal spheres 3 solidified and formed uniformly and completely were thereby obtained.

According to the method of manufacturing a fine metal piece in accordance with this working example, no apparatus for transporting the metal wire chip is provided and the metal wire chip can only be put into the furnace core tube, immediately followed by the step of collecting the fine metal sphere. The working efficiency and the mass-productivity can therefore be improved. The apparatus for this working example may have, for example, a unit for cutting a fine metal wire to form wire chips one by one at regular intervals which unit is provided above the furnace core tube of this embodiment, thereby making it possible to continuously conduct the step of cutting the fine metal wire, the step of spheroidizing the cut metal wire chip and the step of collecting the fine metal sphere.

The fine metal manufacture process in accordance with this embodiment can be applied for metals or alloys which have not been adopted. It is thereby possible to manufacture fine metal spheres having a composition suitable for bumps at an improved efficiency.

In an working example, a gold sphere is manufactured by using a gold wire chip. However, the present invention is not limited to this; other metals suitable for bumps may also be used. Ordinarily, the speed at which the metal wire chip passes through the heating furnace can be known from the initial falling speed. Also, the necessary length of the heating furnace and the maximum temperature thereof are determined from the size of the metal wire chip and the melting point of the metal. Accordingly, it is necessary to change the sizes of the furnace core tube and the heating furnace, the temperature of the heating furnace and other factors if the fine metal sphere is manufactured from a different metal. In other case of some metals, it is necessary to replace the atmosphere in the furnace tube with a special gas atmosphere to prevent chemical reaction in the high-temperature heating furnace.

In the above-described working example, the lid is fitted to the lower end of the furnace core tube. However, the present invention is not limited to this arrangement. For example, instead of using the lid, a lower end portion of the furnace core tube may be worked so as to be tapered, and fine metal spheres may be collected through a lower end opening. A belt conveyor or the like, for example, may also be disposed under the furnace core tube to continuously collect fine metal spheres.

According to this embodiment, as described above, a fine metal sphere can easily be manufactured by melting a freely falling metal wire chip with a heating means and by utilizing the large surface tension of the molten metal. It is therefore possible to provide a spheroidizing process which can be improved in working efficiency and, hence, in mass-productivity by a simple apparatus.

SEVENTH EMBODIMENT

In this embodiment, a spheroidizing process is provided which can be improved in working efficiency and in mass-productivity and which is different from that of the sixth embodiment.

The spheroidizing process for forming fine metal spheres in accordance with this embodiment is characterized in that a metal wire chip transported by a transport means is melted by being heated up to a temperature higher than the melting point of the metal used to form the metal wire chip and is thereby spheroidized.

In this embodiment, based on the above arrangement, the metal wire chip is transported by the transport means and is melted by being heated up to a temperature higher than the melting point of the metal of the metal wire chip during transportation. The surface tension of the molten metal is so large that the molten metal changes in shape to become spherical by itself. The metal wire chip is therefore formed into the shape of a fine metal sphere during transportation.

WORKING EXAMPLE 1

Figure 18:
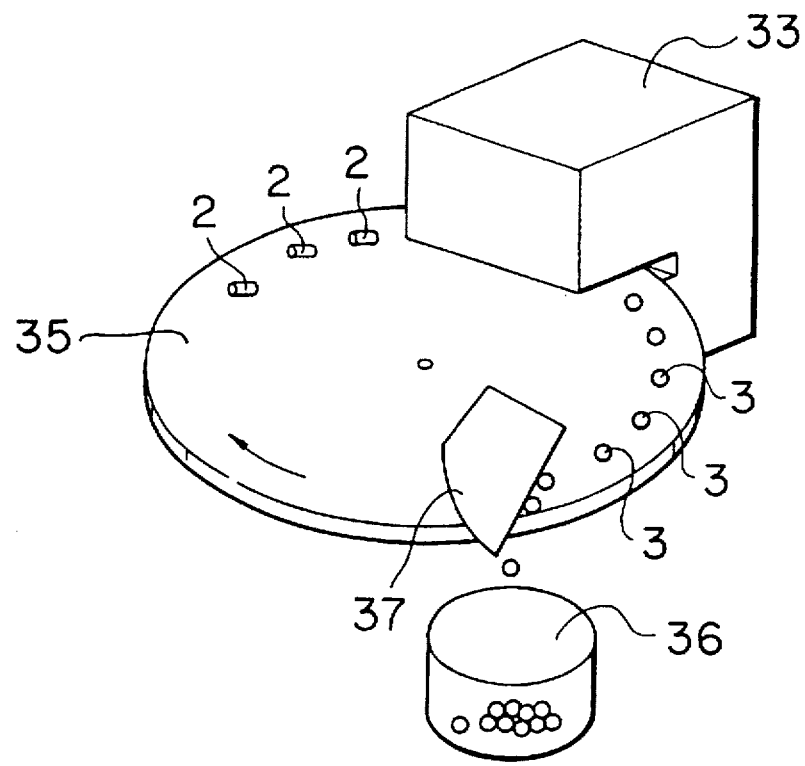
FIG. 18 is a schematic illustration of a device which is used in a heating step in a seventh embodiment of the present invention.

A first working example of this embodiment will be described below with reference to FIG. 18. FIG. 18 is a schematic diagram of an apparatus used for the fine metal sphere manufacture process. In this working example, a gold wire chip (metal wire chip) having a wire diameter of 25 μm, and a length of 0.55 mm is used and a gold sphere (fine metal sphere) having a diameter of 80 μm is manufactured.

The apparatus shown in FIG. 18 has a heat resistant turntable 35 for transporting metal wire chips 2, a motor (not shown) for driving the turntable 35, a generally U-shaped heating furnace 33 for melting the metal wire chips 2, a collecting container 36 for collecting fine metal spheres 3 formed, and a guide 37 for making the fine metal spheres 3 on the turntable 35 fall into the collecting container 36. The turntable 35 is formed of a ceramic and has a circular shape and a diameter of about 200 mm. The maximum temperature in the heating furnace 33 is set to 1200° C. slightly higher than the melting point of gold (1060° C.).

Each metal wire chip 2 cut by a fine metal wire cutter (not shown) is placed on the turntable 35. The metal wire chip 2 is rotated together with the turn table 35, and its temperature starts rising abruptly when the metal wire chip 2 enters the heating furnace 33. The metal wire chip is melted when the temperature becomes higher than the melting point of the metal. Ordinarily, metals change in shape to become spherical by themselves in a molten state because the surface tension thereof is large. The shape of the molten metal is therefore changed into a spherical shape during passage through the heating furnace 33. When the molten metal comes out of the heating furnace 33, the temperature is abruptly reduced and the metal starts solidifying. Finally, a metal sphere is made by the guide 37 to fall into the collecting container 36. Fine metal spheres 3 are thus obtained.

To melt the meal wire chip with certain reliability, there is a need for changing the turntable speed according to the heating capacity of the heating furnace.

The inventors of the present invention actually made an experiment using the above-described apparatus and metal wire chip, and fine metal spheres having a spherical shape formed uniformly and completely were thereby obtained.

Thus, in the fine metal sphere manufacture process in accordance with this working example, the metal wire chip is only placed on the turntable, and the process thereafter automatically proceeds to the step of collecting the fine metal sphere. The working efficiency and the mass-productivity can therefore be improved. Further, the apparatus for this working example may have, for example, a unit for cutting a fine metal wire to form wire chips one by one at regular intervals which unit is provided above the turntable, thereby making it possible to continuously conduct the step of cutting the fine metal wire, the step of spheroidizing the cut metal wire chip and the step of collecting the fine metal sphere.

The fine metal manufacture method in accordance with this working example 1 can be applied for metals or alloys which have not been adopted. It is thereby possible to easily manufacture fine metal spheres having a composition suitable for bumps at an improved efficiency.

WORKING EXAMPLE 2

Figure 19:
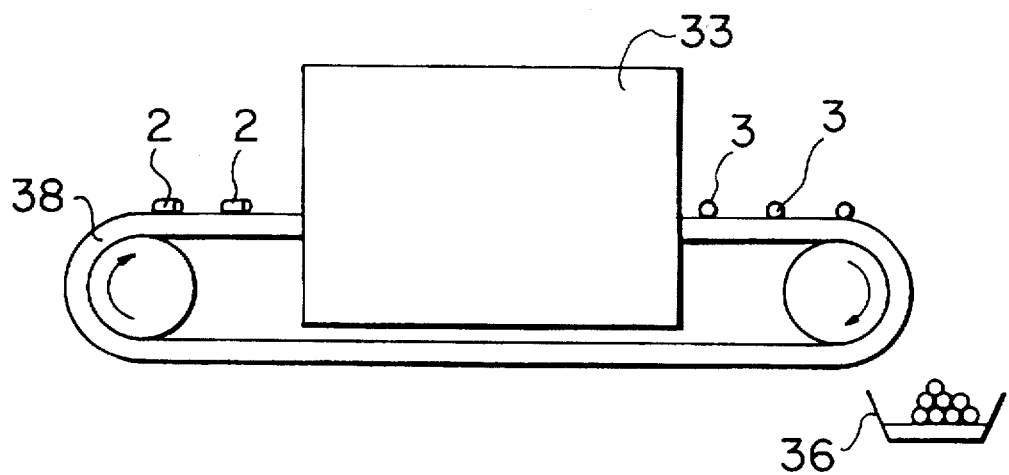
FIG. 19 is a schematic illustration of a device used in a modification of the seventh embodiment.

A second working example will be described below with reference to FIG. 19. FIG. 19 is a schematic diagram of an apparatus used in accordance with the fine metal sphere manufacture method. The material and the size of the metal wire chip used are the same as those of the first working example.

The apparatus shown in FIG. 19 has a belt conveyor for transporting metal wire chips 2, a motor (not shown) for driving the belt conveyor 38, a tunnel type heating furnace 33 for melting the metal wire chips 2, and a collecting container 36 for collecting fine metal spheres 3 formed. The belt conveyor 38 must have a suitable resistance to heat since it passes through the heating furnace 33. For the belt conveyor 38, therefore, a belt formed of a heat resistant steel chains on which a multiplicity of small ceramic trays are mounted is used.

Each metal wire chip 2 cut by a fine metal wire cutter (not shown) is made to fall softly from, for example, above the belt conveyor 38. The metal wire chip 2 is transported by the belt conveyor 38, and its temperature starts rising abruptly when the metal wire chip 2 enters the heating furnace 33. The metal wire chip 2 is melted so that its shape is changed into a spherical shape when the temperature becomes higher than the melting point of the metal. When metal wire chip comes out of the heating furance 33, the temperature is abruptly reduced and the metal starts solidifying. Finally, a metal sphere falls from the belt conveyor 38 to be collected in the collecting container 36. Fine metal spheres 20 formed uniformly and completely were obtained.

In the above-described first and second working examples, a gold sphere is manufactured by using a gold wire chip. However, the present invention is not limited to this; a different metal suitable for bumps may also be used. In such a case, since the melting point differs according to the kind of metal, it is necessary to correspondingly set the maximum temperature of the heating furnace and changing the material of the turn table or the belt conveyor as well as the speed thereof. Also, in the case of some metal, it is necessary to replace the atmosphere in the heating furnace 33 with a special gas atmosphere to prevent chemical reaction in the high-temperature heating furnace 33.

According to this embodiment, as described above, a fine metal sphere can easily be manufactured by melting a metal wire chip transported by the transport means by using the heating means and by utilizing the large surface tension of the molten metal. It is therefore possible to provide a spheroidizing method which can be improved in working efficiency and, hence, in mass-productivity.

EIGHTH EMBODIMENT

In the eighth embodiment, a high-energy beam is used instead of the heating/melting means used in the seventh embodiment.

The process of spheroidizing metal wire chips in the fine metal sphere manufacture method in accordance with the eighth embodiment is characterized by a step of disposing metal wire chips having a certain length on a transport means while spacing them apart, and a step of irradiating each metal wire chip with a high-energy beam during the metal wire transport process so that the metal wire chip is heated up to a temperature higher than the melting point of the metal wire chip to be melted.

In this embodiment, based on the above arrangement, each of metal wire chips is irradiated with a high-energy beam to be melted so that it is heated up to a temperature higher than the melting temperature of the metal. The molten metal, which has a large surface tension, changes in shape to become spherical by itself, i.e., to become a fine metal sphere.

Also, a light condenser means may be used to reduce the minimum spot diameter of the high-energy beam so that the fine metal wire chip can be irradiated at a high efficiency.

WORKING EXAMPLE

Figure 20:
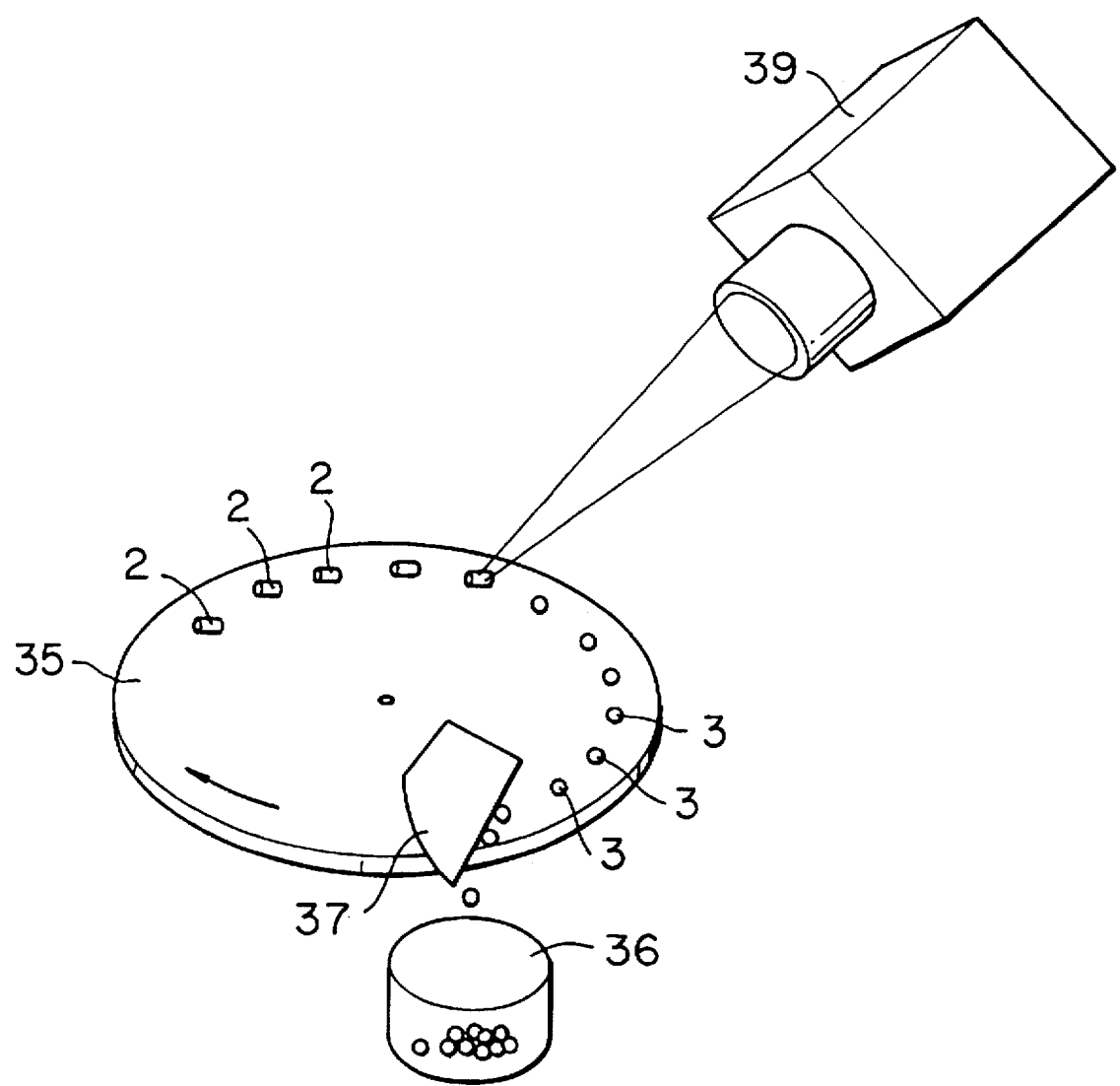
FIG. 20 is a schematic illustration of a device which is used in a heating step of an eighth embodiment of the present invention.

A working example of this embodiment will be described below with reference to the accompanying drawing. FIG. 20 is a schematic diagram of an appartus used in this embodiment. In this working example, a gold wire chip (metal wire chip) having a wire diameter of 25 μm, and a length of 0.55 was used and a gold sphere (fine metal sphere) having a diameter of 80 μm was manufactured.

The apparatus shown in FIG. 20 has a heat resistant turntable 35 for transporting metal wire chips 2, a motor (not shown) for driving the turntable 35, a high-energy beam irradiation unit 39 for irradiating each metal wire chip, a collecting container 36 for collecting fine metal spheres 3 formed, and a guide 37 for making the fine metal spheres 3 on the turntable 35 fall into the collecting container 36. The turntable 35 is formed of a ceramic and has a circular shape and a diameter of about 200 mm. In this method, the heated region is smaller in comparison with other methods, and it is not necessary to form the whole of the turntable 35 in ceramic. For example, only a doughnut-like portion on which metal wire chips are placed may be formed of a ceramic.

A high-luminance xenon lamp is used as a beam source for the high-energy beam irradiation unit 39 (e.g., a beam spot welder). The high-energy beam irradiation unit may incorporate a light condensing device having a concave mirror or a convex lens to further condense the high-energy beam. The object can be heated up to 2000° C. at the maximum by the high-energy beam irradiation unit 39.

To form fine metal spheres 20, metal wire chips 2 cut by a fine metal wire cutter (not shown) were first placed on the turntable 35, and the turntable 2 was driven to move each metal wire chip 2 to a high-energy beam irradiation position. Next, the metal wire chip 2 was irradiated with the high-energy beam to be melted so that it was heated up to a temperature higher than the melting point of the metal. Ordinarily, molten metals have a large surface tension and can change in shape in a molten state to become spherical by themselves. Accordingly, the shape of the molten metal was changed into a spherical shape while it was being irradiated with the high-energy beam. The metal melted and formed into the spherical shape was moved out of the high-energy beam irradiation range by the turntable 35, and the next metal wire chip was moved to the high-energy beam irradiation range. The metal formed into the spherical shape was gradually cooled and solidified to be formed as a fine metal sphere 3 having a diameter of 80 μm, while the next metal wire chip was irradiated with the high-energy beam. Thus, the metal wire chips placed on the turntable 35 were successively heated and melted. Finally, fine metal spheres 3 thereby formed were made by the guide 37 to fall into the collecting container 36, thereby being collected.

If a high-energy beam formed by condensation using a light condensing device having a lens or the like is used, each metal wire chip can be irradiated with the high-energy beam condensed. Fine metal wire chips could therefore be melted in a short time so that it may be heated at an improved efficiency by concentrated energy.

Thus, according to the fine metal sphere manufacture method of this embodiment, the metal wire chip is only placed on the turntable, and the process thereafter automatically proceeds to the step of collecting the fine metal sphere. The working efficiency and the mass-productivity is therefore be improved. Further, the apparatus for this working example may have, for example, a unit for cutting a fine metal wire to form wire chips one by one at regular intervals which unit is provided above the turntable of this embodiment, thereby making it possible to continuously conduct the step of cutting the fine metal wire, the step of spheroidizing the cut metal wire chips and the step of collecting the fine metal spheres.

Also, the method of this embodiment can be applied for metals or alloys which have not been adopted. It is thereby possible to easily manufacture fine metal spheres having a composition suitable for bumps at an improved efficiency. If fine metal spheres are manufactured by using other metals, it is necessary to change the heating temperature and the turntable speed with respect to metals used, since the melting points differs with respect to the metals. Also, according to the metal used, heating may be effected in a special gas atmosphere in order to prevent chemical reaction at a high temperature.

In the above-described embodiment, a xenon lamp is used as the high-energy beam source, but the present invention is not limited to this. Alternatively, a laser, an infrared radiation heater or the like may be used as the high-energy beam source. An infrared irradiation unit using an infrared radiation heater is specifically suitable for melting a low-melting-point metal used for a soldering material, because the maximum temperature of the infrared radiation heater is about 1200° C.

Also, in the above-described embodiment, a turntable is used as the metal wire chip transport means, but the present invention is not limited to this, and a belt conveyor may alternatively be used. In this case, needless to say, the belt conveyor must be formed of materials superior in resistance to heat. For example, to form the belt conveyor, the belt may be formed of heat resistant steel chains, and a multiplicity of small ceramic trays may be mounted on the belt.

According to this embodiment, as described above, a fine metal sphere can easily be manufactured by irradiating a metal wire chip with a high-energy beam so that the metal wire chip is melted and by utilizing the large surface tension of the molten metal. It is therefore possible to provide a fine metal sphere manufacture method which can be improved in working efficiency and, hence, in mass-productivity.

NINTH EMBODIMENT

In the methods of producing fine metal spheres of the seventh and eighth embodiments, a fine metal wire is cut into metal wire chips having a predetermined length, which have to be then arranged manually one by one at equal spaces on a melting pan or the like.

While there may be a variety of means available for arranging fine metal chips, including the ones described above, it is desirable, in not a few cases, that the step of cutting the metal wire into chips and that of fusing them into fine metal spheres be, if possible, unified, depending on the scale on which the fine metal spheres are produced.

This embodiment has been made in view of the above situation. It provides a method of producing fine metal spheres which helps to enhance the operational efficiency and which allows mass production with ease.

The method of producing fine metal spheres in accordance with this ninth embodiment is characterized in that, after stretching a fine metal wire on the upper surface of a heat-resistant base plate on which recesses are formed, the stretched fine metal wire is heated to melt, thereby making it possible to effect the cutting of the fine metal wire and the spheroidizing thereof simultaneously to obtain fine metal spheres.

It is desirable that the above-mentioned base plate be equipped with a number of recesses whose size is uniform at least in terms of the recess openings over which the fine metal wire is stretched.

Further, it is desirable that the fine metal wire be heated to melt after placing a heat-resistant presser lid upon the upper surface of the above-mentioned base plate, on which the fine metal wire is stretched.

In this embodiment, with the construction described above, a fine metal wire stretched on the upper surface of the base plate is heated to cut it by fusion into metal chips having a length corresponding to the size of the recesses, and these metal chips obtained by fusion are retained on the recess bottoms so as to spheroidize them by utilizing the surface tension inherent in molten metal. Afterwards, they are allowed to calmly cool off to solidify so as to be formed into fine metal spheres.

Since the above-mentioned base plate has a number of recesses whose size is uniform at least in terms of the openings over which a fine metal wire is stretched, all the metal wire chips obtained by fusion have the same length, thus making it possible to mass-produce fine metal spheres having the same size with ease.

Further, by heating the fine metal wire to melt it after placing the heat-resistant presser lid upon the upper surface of the above-mentioned base plate, on which the fine metal wire is stretched, any deviation of the fusing positions, caused by the deformation of the metal wire chips due to the thermal expansion as a result of heating the fine metal wire, can be prevented. Further, if, in the case where a large number of openings are formed on the base plate, some variation occurs in terms of the time at which the fusion takes place at the different recesses, the fine metal wire can be reliably fused for each recess.

WORKING EXAMPLE

Figure 21A:
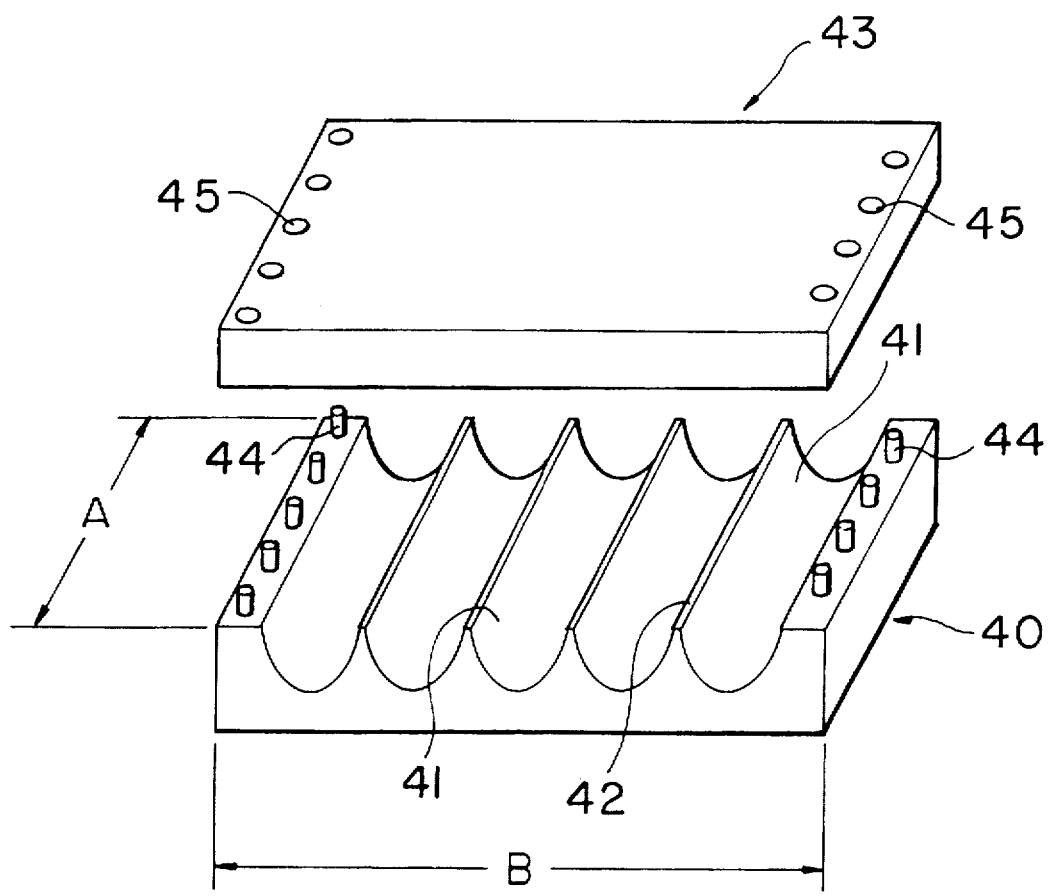
FIG. 21a is a schematic illustration of a base plate and a pressing cover used in a ninth embodiment of the present invention in which cutting and melting are conducted simultaneously.
Figure 21B:
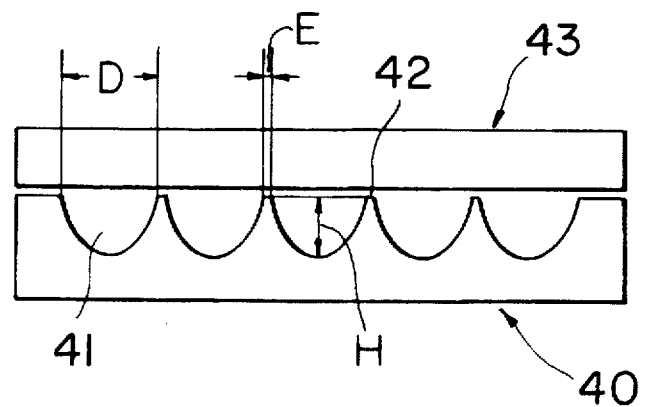
FIG. 21b is a schematic side elevational view of the base plate and the pressing cover which are brought together.
Figure 22:
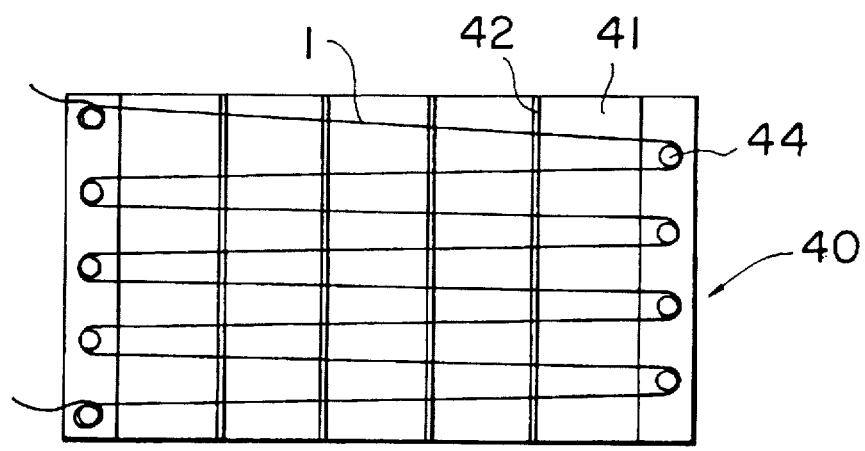
FIGS. 22 and 23 are illustrations of a method for stretching fine metal wires on the base plate in the ninth embodiment.
Figure 23:
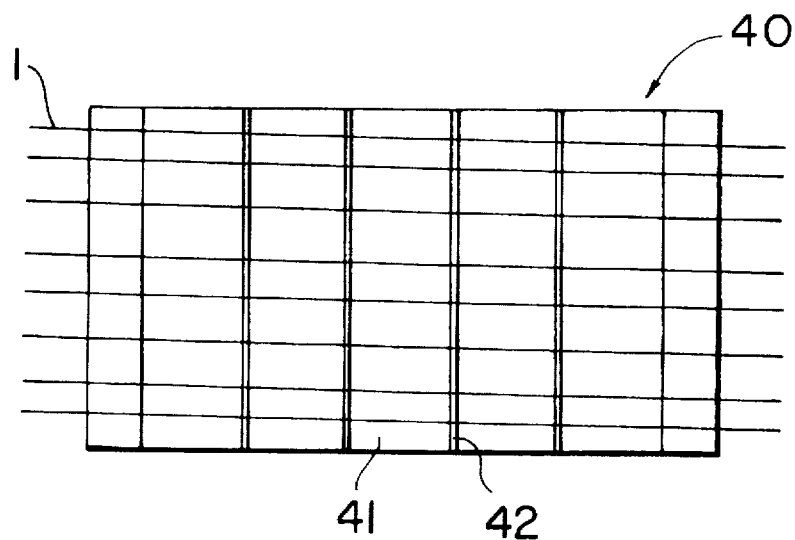
Figure 24:
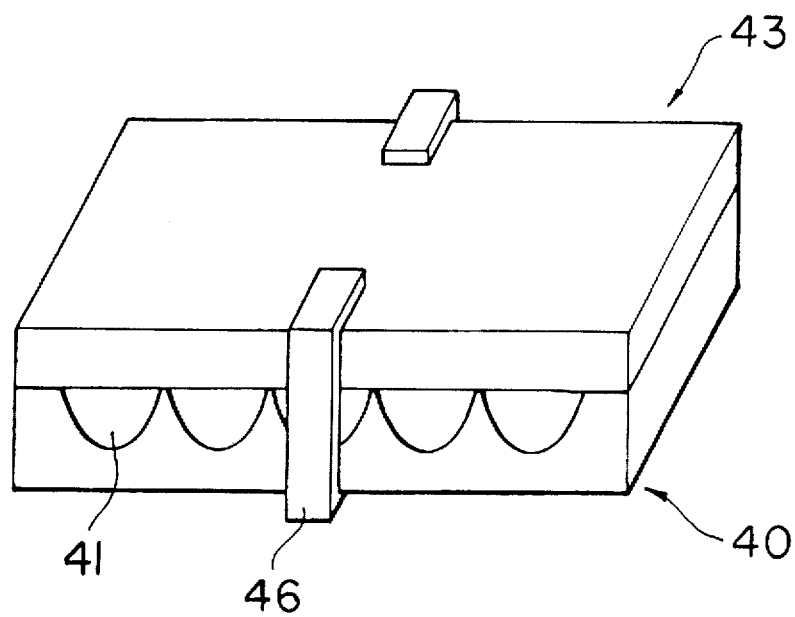
FIG. 24 is illustration of the base plate of FIGS. 22 and 23, on which the fine metal wires are stretched, and a presser cover fixed thereto.

In the following, a working example of this embodiment will be described with reference to FIGS. 21A to 24. FIG. 21A(a) is a schematic diagram showing the base plate and the presser lid used in an embodiment of this invention; FIG. 21B is a schematic side view showing the base plate and the presser lid mated with each other; FIGS. 22 and 23 are diagrams for illustrating methods of stretching (a) fine metal wire(s) on the base plate; and FIG. 24 is a schematic diagram showing the base plate on which the fine metal wire(s) is(are) stretched and the presser lid when they are firmly attached to each other. In this working example, a gold wire (fine metal wire) having a diameter of 20 µm was used to produce gold spheres (fine metal spheres) having a diameter of 80 µm.

Formed on the heat-resistant base plate 40 shown in FIGS. 21A(a) and 21B are a number of grooves (recesses) 41 having a fixed width. It is desirable that the base plate 40 be formed of a heat-resistant material such as carbon or ceramics. The dimension of the base plate 40, which is not particularly limited, was 30 mm in length (A) and 50 mm in width (B). The section of each groove 41 had a semi-spherical configuration; the width D of the opening of each groove 41 was 0.8 mm; the width E of each of protrusions 42 provided between the grooves 41 was 0.1 mm; and the depth H of each groove 41 was 0.35 mm. Actually, the configuration of the grooves 41 is not limited to any particular type; instead of a semi-spherical one, the configuration of the section of each groove 41 may be a square or a V-shaped one. When its section has a V-shaped configuration, however, the bottom portion thereof has to be rounded at 0.05 mm radius or more. Further, it is desirable that the width E of the inter-groove protrusions 42 be as small as possible.

The width D of the opening of each groove is determined by the diameter of the fine metal wire and the size of the fine metal spheres to be produced. In the case of this working example, the forming of the grooves with an accuracy of ±0.1 mm in the size of their widths results in the variation of about 10% or less regarding the length of the fused metal wire chips and the error in the radius when formed into metal spheres was approximately 5% or less, thus making it possible to produce uniform fine metal spheres with high accuracy. Accordingly, when fusing a fine metal wire described below, no great influence occurs on the accuracy in the metal spheres obtained no matter into which one of adjacent grooves a gold wire portion disposed just upon an groove protrusion 42 may drop. Further, a number of pins 44 were provided on both ends of the base plate 40, at a space substantially equal to the pin diameter, with each of the pins 44 on one end being arranged to have a position corresponding to another position defined between adjacent two pins disposed on the other end. By virtue of this arrangement, a fine metal wire can be stretched substantially in parallel on the upper surface of the base plate 40.

The presser lid 43, which was also made of a ceramic material, was placed on the base plate 40, thereby serving to fix the fine metal wire 1 which was stretched over the grooves 41. The surface of the presser lid 43 facing the base plate 40 was machined to be flat. Further, in the presser lid 43 were provided holes 45 corresponding to the pins 44. It is desirable that the gap between the base plate 40 and the presser lid 43 when they are put together be as small as possible. The base plate 40 and the presser lid 43 were finished so that the gap width ranged from 0 to 10 µm at the most. The fine metal wire 1 was sandwiched between the base plate 40 and the presser lid 43 thus finished, thereby fixing the fine metal wire.

To produce fine metal spheres, the fine metal wire 1 was first stretched on the upper surface of the base plate 40 in such a manner that it extended perpendicular to the grooves 41. In this working example, the fine metal wire 1 was, as shown in FIG. 45, sequentially disposed round the pins 44 provided on both ends of the base plate 40, thereby stretching the fine metal wire on the upper surface of the base plate 40. Further, as shown in FIG. 23, it is also possible to provide no pins on the base plate 40, arranging a plurality of fine metal wires 1 in parallel. In the case where a plurality of fine metal wires 1 are thus arranged, the employment of the presser lid 43 for fixing the fine metal wire 1 is of particular significance.

After stretching the fine metal wire (gold wire) 1 on the base plate 40, the presser lid 43 was placed on the base plate 40, fixing it by a fixing member 46 such as a clamp or a hinge, as shown in FIG. 24. In this condition, the base plate was put, for example, in an induction heater, melting the gold wire at 1060° C. Simultaneously with its melting, the gold wire was cut by fusion into wire chips at the protrusions 42 between the grooves 41, the wire chips dropping into the grooves 41. In this embodiment, the width D of the grooves 41 was 0.8 mm, so that each of the gold wire chips was 0.8 mm long. Thus, the gold wire chips obtained by the fusion were arranged in the grooves, at an appropriate interval (approximately equal to the diameter of the pins 44).

Generally, molten metal has a large surface tension, so that, when a fine solid piece thereof is heated at a temperature not lower than its melting point, it tends to become spherical of itself when in a molten state. Accordingly, a fine metal sphere could be produced solely by melting a metal piece having a mass identical to that of the metal sphere to be obtained and by allowing it to calmly cool off to solidify.

Accordingly, the metal wire chips arranged at fixed spaces in the grooves 41 melted in the furnace and were formed into fine metal spheres of a uniform size. Finally, the base plate 40 was taken out of the furnace and was allowed to cool off slowly, thereby obtaining fine metal spheres having the size desired.

Thus, in the method of producing fine metal spheres of this embodiment, the step of cutting the fine metal wire and that of melting the metal wire chips can be unified, so that the operation of arranging the metal wire chips after the cutting is not necessary, thus enhancing the operational efficiency in the process of producing fine metal spheres. Further, by forming a large number of grooves 41 or forming them long, an improvement could be attained in terms of mass-productivity.

Further, this embodiment adopts a heat-resistant material for the base plate 40 and the presser lid 43, which means, once produced, these components can be used semi-permanently.

Figure 25:
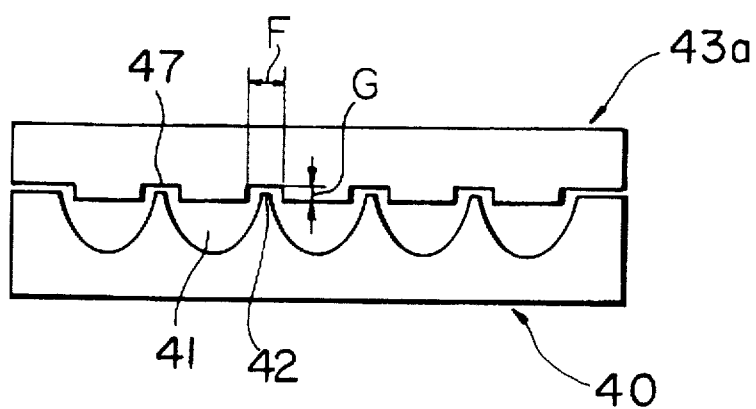
FIGS. 25 and 26 are illustrations of a presser lid used in the ninth embodiment.
Figure 26:
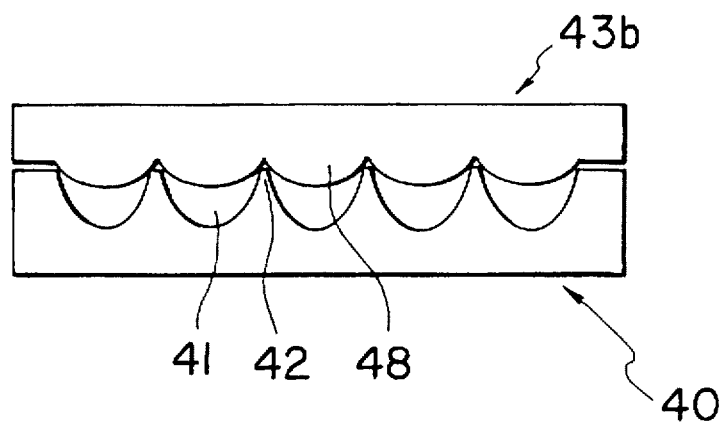

FIGS. 25 and 26 show other examples of the presser lid used in this embodiment. The presser lid 43a shown in FIG. 25 had recesses 47 with a width F of 0.2 mm and a depth G of 0.1 mm, which recesses were formed in those sections corresponding to the protrusions 42 between the grooves 41 of the base plate 40. In a case where the presser lid 43a was formed in this way, no mechanical finishing was needed regarding the surface of the presser lid portions extended between the recesses 47, thus facilitating the machining of the presser lid 43a.

The presser lid 43b shown in FIG. 26 was formed such that the surface portion facing the base plate 40 had an undulated configuration. The convex portions 48 of the undulation had a configuration corresponding to the grooves 41 of the base plate 40. When the presser lid 43b shown in FIG. 26 was used, the fine metal wire was pressed downwards, during the fusing operation, at the respective central portions of the grooves 41 by the presser lid 43b, so that the fine metal wire could be reliably cut, at the time of fusion, at the protrusions 42, thereby uniformalizing the size of the metal wire chips obtained by the fusion.

Figure 27:
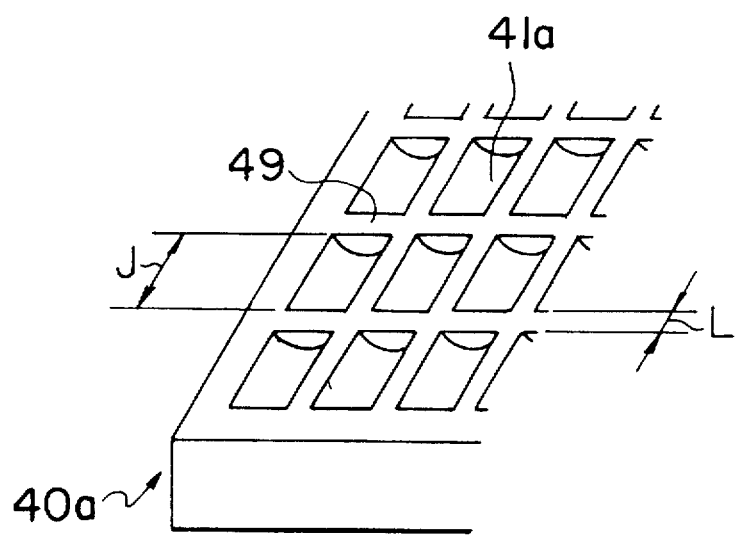
FIGS. 27 and 28 are illustrations of different examples of the base plate used in the present invention.
Figure 28:
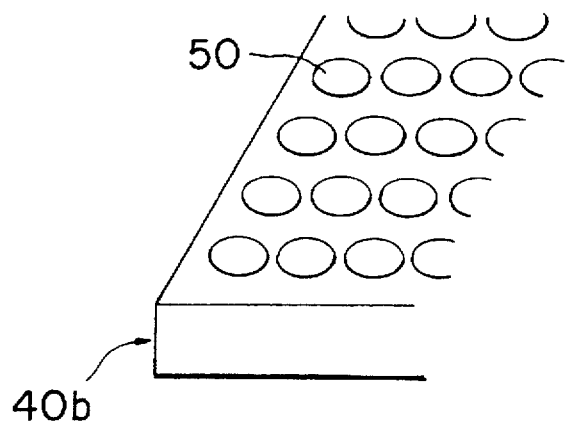

FIGS. 27 and 28 show other examples of the base plate used in this embodiment. The base plate 40a shown in FIG. 27 was characterized by partitions 49, which were provided in the grooves 41 of the base plate 40 shown in FIGS. 21 and 22, thereby dividing the grooves 41 into small chambers 41a having a length J of 4 mm. The thickness L of the partitions 49 was 1 mm. The base plate 40b shown in FIG. 28 was characterized in that, instead of grooves, it had holes 50 having a diameter M of approximately 4 mm. When the base plate shown in FIG. 27 or 28 was used, the fine metal wire chips obtained by fusing a fine metal wire dropped into the small chambers 41a or the holes 50, one chip into one chamber or one hole, so that no two or more metal wire chips were allowed to melt together, thus preventing any large-sized defective from being produced. Thus, by using the base plate shown in FIG. 27 or 28, an improvement could be attained in terms of yield.

Figure 29:
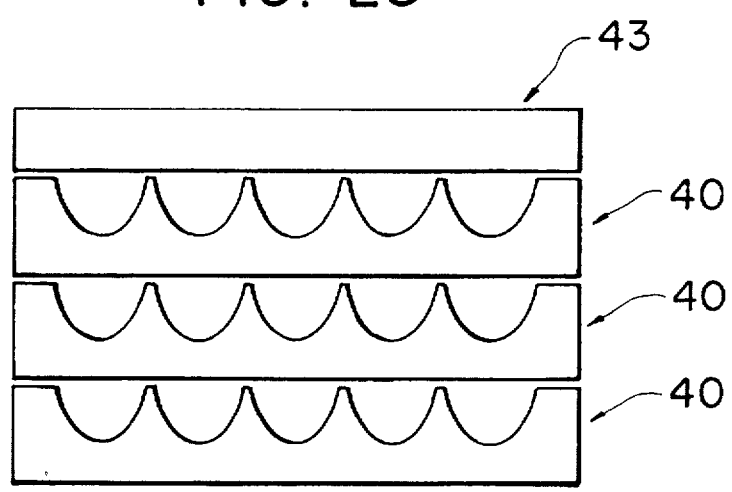
FIG. 29 is an illustration of a modification of the ninth embodiment in which three base plates are used in stack.

Although the above embodiment has been described in connection with the case where a single base plate was used, it is also possible to stack a plurality of base plates one on top of the other. For example, as shown in FIG. 29, three base plates 10 may be stacked together before they are put in a heating furnace. In that case, however, the bottom surfaces of the top and the middle base plates 40 must be finished with the same level of accuracy as the presser lid. When the base plates 40 are thus used to have the function of the presser lid, the presser lid 43 has only to be placed on the uppermost base plate 40, so that the number of presser lids 43 can be reduced and a large quantity of fine metal spheres can be produced by a single treatment.

Figure 30:
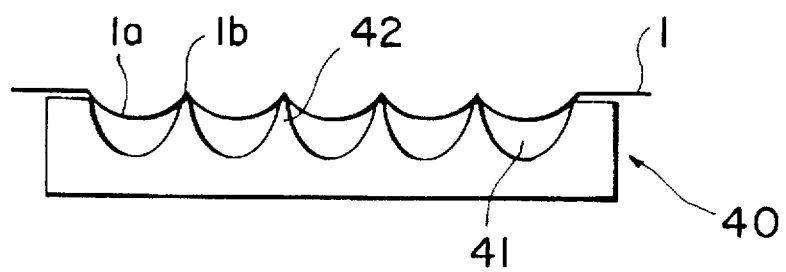
FIG. 30 is an illustration of a modification of the ninth embodiment in which fine metal wires are beforehand prepared in a wave-like form to eliminate the necessity for a cover.

While the above embodiment has been described in connection with the case where the fine metal wire 1 is linear, this should not be construed as restrictive. For example, it may have an undulated configuration, as shown in FIG. 30, with the troughs 1a of the undulation corresponding to the grooves 41. When fused, such a fine metal wire 1 is cut at the crests 1b so that the protrusions 42 require no precision finish, thus facilitating the production of the base plate. In that case, however, the length of each metal wire chip obtained corresponds to the length of each arc of the undulation.

Further, while the above embodiment has been described in connection with the case where a presser lid is used when effecting fusion, the presser lid can be omitted if the fine metal wire has a configuration as shown in FIG. 30. Apart from this, it goes without saying that the presser lid can be omitted when the fine metal spheres do not particularly require precision.

Further, although the above embodiment has been described in connection with the case where the grooves and the holes of the base plate have a fixed size, this should not be construed as restrictive. It is also possible to form several types of grooves, holes, etc. of different sizes on a single base plate, thereby making it possible to produce fine metal spheres of different sizes by a single process.

As described above, in accordance with this embodiment, the cutting of a fine metal wire and the fusion of the metal wire chips obtained through the cutting can be effected by a single process by stretching the fine metal wire on the upper surface of a base plate and heating the base plate to a high temperature, thus providing a method of producing fine metal spheres which helps to attain an improvement in terms of the operational efficiency and mass-productivity in the process of producing fine metal spheres.

INDUSTRIAL APPLICABILITY

As described above, this invention makes it possible to efficinetly produce fine metal spheres having a uniform size and a satisfactory configuration and involving no limitations in terms of purity and composition, so that the method of this invention can be applied to the production of fine metal spheres of a uniform size to be used as bumps required in the field of semi-conductor packaging.

What is claimed is:

1. A method of producing soft fine metal spheres for semiconductor packaging from a material selected from gold and copper, said method comprising the steps of:
    a) arranging a plurality of fine wires made from one of gold and copper in parallel on a flat base plate, each of said wires having a diameter of not more than 100 µm;
    b) cutting said fine wires into wire chips having an equal mass relative to each other and a chip length/chip diameter ratio between 5 and 100 by utilizing a cutting jig having cutting edges which are arranged at a constant pitch;
    c) arranging the resulting wire chips so that said chips are spaced apart a minimum distance sufficient to prevent the chips from merging when melted;
    d) heating the resulting spaced-apart wire chips to a temperature up to but not exceeding 100° C. above the melting point thereof, thereby forming said chips into molten spheres; and
    e) cooling the resulting molten spheres, thereby forming solid spheres.

2. The method according to claim 1, wherein each of said solid spheres has a diameter no greater than 100 µm and the range of the diameters of the spheres is within 10% of the average diameter of the spheres.

3. A method of producing soft fine metal spheres for semiconductor packaging from a material selected from gold and copper, said method comprising the steps of:
    a) feeding a fine wire made from one of gold and copper by a predetermined length out of the outlet end of a guide having a fine internal bore, said wire having a diameter not more than 100 µm;
    b) cutting said wire into wire chips having an equal mass relative to each other and a chip length/chip diameter ratio between 5 and 100 by actuating a cutting device arranged in close proximity of said outlet end;
    c) arranging the wire chips so that the wire chips are spaced apart a minimum distance sufficient to prevent the chips from merging when melted;
    d) heating the resulting spaced-apart wire chips up to but not exceeding 100° C. above the melting point thereof, thereby forming said wire chips into molten spheres; and
    e) cooling the resulting molten spheres, thereby forming solid spheres.

4. The method according to claim 3, wherein each of said solid spheres has a diameter no greater than 100 µm and the range of the diameters of the spheres is within 10% of the average diameter of the spheres.

5. A method of producing soft fine metal spheres for semiconductor packaging from a material selected from gold and copper, said method comprising the steps of:
    a) disposing both a first guide having a minute internal bore of a first diameter, and a second guide having a fine internal bore of a diameter greater than that of said first guide so that said internal bores of said first and second guides are aligned with each other;
    b) inserting a fine wire made from one of gold and copper and having a diameter of not more than 100 µm through said bores of said first and second guides until the end of the fine wire is received by a predetermined length in said bore of said second guide;
    c) causing a relative radial movement between said first guide and said second guide, thereby shearing the fine wire into a wire chip having a chip length/chip diameter ratio between 5 and 100;
    d) repeating steps (b) and (c), thereby forming a plurality of wire chips having an equal mass relative to each other;
    e) arranging the wire chips so that the wire chips are spaced apart a minimum distance sufficient to prevent the chips from merging when melted;
    f) heating the resulting spaced-apart wire chips up to but not exceeding 100° C. above the melting point thereof, thereby forming said wire chips into molten spheres; and
    g) cooling the resulting molten spheres, thereby forming solid spheres.

6. The method according to claim 5, wherein each of said solid spheres has a diameter no greater than 100 µm and the range of the diameters of the spheres is within 10% of the average diameter of the spheres.

7. A method of producing soft fine metal spheres for semiconductor packaging from a material selected from gold and copper, said method comprising the steps of:
    a) holding the end of a fine wire made from one of gold and copper and of not more than 100 µm in diameter by a holding device;
    b) moving the holding device, thereby extracting said fine wire from a guide by a predetermined length;
    c) cutting said fine wire into a wire chip having a chip length/chip diameter ratio between 5 and 100 by utilizing a cutting device disposed in close proximity of said holding device;
    d) repeating steps (b) and (c), thereby forming a plurality of wire chips having an equal mass relative to each other;
    e) arranging the wire chips so that the wire chips are spaced apart a minimum distance sufficient to prevent the chips from merging when melted;
    f) heating the resulting spaced-apart wire chips up to but not exceeding 100° C. above the melting point thereof, thereby forming said wire chips into molten spheres; and
    g) cooling the resulting molten spheres, thereby forming solid spheres.

8. The method according to claim 7, wherein each of said solid spheres has a diameter no greater than 100 µm and the range of the diameters of the spheres is within 10% of the average diameter of the spheres.

9. A method of producing soft fine metal spheres for semiconductor from a material selected from gold and copper, said method comprising the steps of:
    a) extracting a fine wire made from one of gold and copper and of not more than 100 µm in diameter by a predetermined length out of a guide by means of feed rolls arranged on the outlet side of said guide;
    b) cutting said fine wire into a wire chip having a chip length/chip diameter ratio between 5 and 100 by utilizing a cutting device disposed in close proximity to said feed rolls;

c) repeating steps (a) and (b), thereby forming a plurality of wire chips having an equal mass relative to each other;

d) arranging the wire chips to that the wire chips are spaced apart a minimum distance sufficient to prevent the chips from merging when melted;

e) heating the resulting spaced-apart wire chips up to but not exceeding 100° C. above the melting point thereof, thereby forming said wire chips into molten spheres; and f) cooling the resulting spheres, thereby forming solid spheres.

10. The method according to claim 9, wherein the outer periphery of one of said feed rolls is formed of an elastic material.

11. The method according to claim 9, wherein each of said solid spheres has a diameter no greater than 100 µm and the range of the diameters of the spheres is within 10% of the average diameter of the spheres.

12. A method of producing soft fine metal spheres for semiconductor packaging from a material selected from gold and copper, said method comprising the steps of:

a) arranging a cutting device having a first roll provided with a plurality of cutting edges disposed at a predetermined circumferential pitch, a second roll in contact with said first roll, and a guide portion for guiding a fine wire between said first and second rolls;

b) driving at least one of said first roll and said second roll, thereby clamping and tracking a fine wire made from one of gold and copper and not more than 100 µm in diameter into a nip between said first and second rolls and thereby cutting said fine wire into wire chips having an equal mass relative to each other and a chip length/chip diameter ratio between 5 and 100 by utilizing said cutting edges;

c) arranging the wire chips so that the wire chips are spaced apart a minimum distance sufficient to prevent the chips from merging when melted;

d) heating the resulting spaced-apart wire chips up to but not exceeding 100° C. above the melting point thereof, thereby forming said wire chips into molten spheres; and e) cooling the resulting molten spheres, thereby forming solid spheres.

13. The method according to claim 12, wherein each of said solid spheres has a diameter no greater than 100 µm and the range of the diameters of the spheres is within 10% of the average diameter of the spheres.

14. A method of producing soft fine metal spheres for semiconductor packaging from a material selected from gold and copper, said method comprising the steps of:

a) preparing wire chips from one of gold and copper, each chip having a diameter not more than 100 µm, an equal mass relative to each other, and a chip length/chip diameter ratio between 5 and 100;

b) arranging the wire chips spaced apart a minimum distance sufficient to prevent the chips from merging when melted;

c) conveying said wire chips through a heating means, thereby heating said wire chips to a temperature up to but not exceeding 100° C. above the melting point thereof, and thereby forming said chips into molten spheres; and d) cooling the resulting molten spheres to solidify said spheres, thereby forming solid spheres.

15. The method according to claim 14, wherein each of said solid spheres has a diameter no greater than 100 µm and the range of the diameters of the spheres is within 10% of the average diameter of the spheres.

16. A method of producing soft fine metal spheres for semiconductor packaging from a material selected from gold and copper, said method comprising the steps of:

a) providing a heat resistant base plate having a top surface defining a plurality of recesses, b) stretching a fine wire made from one of gold and copper and of not more than 100 µm in diameter across said recesses such that the ratio of the diameter relative to the amount the wire spans each groove is between 5 and 100, and c) heating the stretched fine wire to a temperature up to but not exceeding 100° C. above its melting point, thereby melting said fine wire and separate said fine wire into uniform portions while simultaneously forming the resulting separated portions of wire into molten spheres;

d) cooling the resulting molten spheres, thereby forming solid spheres.

17. The method according to claim 16, wherein said base plate has a plurality of said recesses, at least the openings of the recesses over which the fine wire is stretched being made to have an equal size.

18. The method according to claim 17, including placing a pressing cover on a top surface of said base plate on which said fine wire is stretched prior to said heating step.

19. The method according to claim 16, wherein:

each of said solid spheres has a diameter no greater than 100 µm;

the range of the diameters of the spheres is within 10% of the average diameter of the spheres; and further including the steps of conveying said chips through said heating means by free fall, wherein an atmosphere within said heating means is one of a vacuum and an inert gas; and preventing convection from occurring within said heating means.

* * * * *